United States Patent
Tajalli

(10) Patent No.: US 10,554,380 B2
(45) Date of Patent: Feb. 4, 2020

(54) DYNAMICALLY WEIGHTED EXCLUSIVE OR GATE HAVING WEIGHTED OUTPUT SEGMENTS FOR PHASE DETECTION AND PHASE INTERPOLATION

(71) Applicant: Kandou Labs, S.A., Lausanne (CH)

(72) Inventor: Armin Tajalli, Salt Lake City, UT (US)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 15/881,509

(22) Filed: Jan. 26, 2018

(65) Prior Publication Data

US 2019/0238308 A1  Aug. 1, 2019

(51) Int. Cl.
| | | |
|---|---|---|
| *H04L 7/033* | (2006.01) | |
| *H03K 19/21* | (2006.01) | |
| *H03L 7/08* | (2006.01) | |
| *H03L 7/085* | (2006.01) | |
| *H03L 7/099* | (2006.01) | |
| *H04L 7/00* | (2006.01) | |

(52) U.S. Cl.
CPC ......... *H04L 7/0331* (2013.01); *H03K 19/215* (2013.01); *H03L 7/085* (2013.01); *H03L 7/0807* (2013.01); *H03L 7/099* (2013.01); *H04L 7/0087* (2013.01)

(58) Field of Classification Search
CPC ... H04L 7/0331; H03K 19/215; H03L 7/0807; H03L 7/085; H03L 7/099; H03L 7/0087
USPC ......................................................... 375/355
See application file for complete search history.

(56) References Cited

U.S. PATENT DOCUMENTS

| 668,687 A | 2/1901 | Mayer |
|---|---|---|
| 780,883 A | 1/1905 | Hinchman |

(Continued)

FOREIGN PATENT DOCUMENTS

| CN | 1671092 | 9/2005 |
|---|---|---|
| CN | 1864346 | 11/2006 |

(Continued)

OTHER PUBLICATIONS

"Introduction to: Analog Computers and the DSPACE System," Course Material ECE 5230 Spring 2008, Utah State University, www.coursehero.com, 12 pages.

(Continued)

*Primary Examiner* — Kevin M Burd
(74) *Attorney, Agent, or Firm* — InventionMine LLC

(57) ABSTRACT

Methods and systems are described for receiving a reference clock signal and a phase of a local oscillator signal at a dynamically-weighted XOR gate comprising a plurality of logic branches, generating a plurality of weighted segments of a phase-error signal, the plurality of weighted segments including positive weighted segments and negative weighted segments, each weighted segment of the phase-error signal having a respective weight applied by a corresponding logic branch of the plurality of logic branches, generating an aggregate control signal based on an aggregation of the weighted segments of the phase-error signal, and outputting the aggregate control signal as a current-mode output for controlling a local oscillator generating the phase of the local oscillator signal, the local oscillator configured to induce a phase offset into the local oscillator signal in response to the aggregate control signal.

20 Claims, 14 Drawing Sheets

(56) References Cited

U.S. PATENT DOCUMENTS

| | | |
|---|---|---|
| 3,196,351 A | 7/1965 | Slepian |
| 3,636,463 A | 1/1972 | Ongkiehong |
| 3,939,468 A | 2/1976 | Mastin |
| 4,163,258 A | 7/1979 | Ebihara |
| 4,181,967 A | 1/1980 | Nash |
| 4,206,316 A | 6/1980 | Burnsweig |
| 4,276,543 A | 6/1981 | Miller |
| 4,486,739 A | 12/1984 | Franaszek |
| 4,499,550 A | 2/1985 | Ray, III |
| 4,722,084 A | 1/1988 | Morton |
| 4,772,845 A | 9/1988 | Scott |
| 4,774,498 A | 9/1988 | Traa |
| 4,839,907 A | 6/1989 | Saneski |
| 4,864,303 A | 9/1989 | Ofek |
| 4,897,657 A | 1/1990 | Brubaker |
| 4,974,211 A | 11/1990 | Corl |
| 5,017,924 A | 5/1991 | Guiberteau |
| 5,053,974 A | 10/1991 | Penz |
| 5,166,956 A | 11/1992 | Baltus |
| 5,168,509 A | 12/1992 | Nakamura |
| 5,266,907 A | 11/1993 | Dacus |
| 5,283,761 A | 2/1994 | Gillingham |
| 5,287,305 A | 2/1994 | Yoshida |
| 5,311,516 A | 5/1994 | Kuznicki |
| 5,331,320 A | 7/1994 | Cideciyan |
| 5,412,689 A | 5/1995 | Chan |
| 5,449,895 A | 9/1995 | Hecht |
| 5,459,465 A | 10/1995 | Kagey |
| 5,461,379 A | 10/1995 | Weinman |
| 5,510,736 A | 4/1996 | Van De Plassche |
| 5,511,119 A | 4/1996 | Lechleider |
| 5,528,198 A | 6/1996 | Baba |
| 5,553,097 A | 9/1996 | Dagher |
| 5,566,193 A | 10/1996 | Cloonan |
| 5,599,550 A | 2/1997 | Kohlruss |
| 5,602,884 A | 2/1997 | Wieczorkiewicz et al. |
| 5,626,651 A | 5/1997 | Dullien |
| 5,629,651 A | 5/1997 | Mizuno |
| 5,659,353 A | 8/1997 | Kostreski |
| 5,727,006 A | 3/1998 | Dreyer |
| 5,748,948 A | 5/1998 | Yu |
| 5,802,356 A | 9/1998 | Gaskins |
| 5,825,808 A | 10/1998 | Hershey |
| 5,856,935 A | 1/1999 | Moy |
| 5,875,202 A | 2/1999 | Venters |
| 5,945,935 A | 8/1999 | Kusumoto |
| 5,949,060 A | 9/1999 | Schattschneider |
| 5,982,954 A | 11/1999 | Delen |
| 5,995,016 A | 11/1999 | Perino |
| 6,005,895 A | 12/1999 | Perino |
| 6,026,134 A | 2/2000 | Duffy et al. |
| 6,084,883 A | 7/2000 | Norrell |
| 6,119,263 A | 9/2000 | Mowbray |
| 6,172,634 B1 | 1/2001 | Leonowich |
| 6,175,230 B1 | 1/2001 | Hamblin |
| 6,232,908 B1 | 5/2001 | Nakaigawa |
| 6,278,740 B1 | 8/2001 | Nordyke |
| 6,307,906 B1 | 10/2001 | Tanji |
| 6,316,987 B1 | 11/2001 | Dally |
| 6,346,907 B1 | 2/2002 | Dacy |
| 6,359,931 B1 | 3/2002 | Perino |
| 6,378,073 B1 | 4/2002 | Davis |
| 6,380,783 B1 | 4/2002 | Chao et al. |
| 6,384,758 B1 | 5/2002 | Michalski |
| 6,389,091 B1 | 5/2002 | Yamaguchi |
| 6,398,359 B1 | 6/2002 | Silverbrook |
| 6,404,820 B1 | 6/2002 | Postol |
| 6,417,737 B1 | 7/2002 | Moloudi |
| 6,433,800 B1 | 8/2002 | Holtz |
| 6,452,420 B1 | 9/2002 | Wong |
| 6,473,877 B1 | 10/2002 | Sharma |
| 6,483,828 B1 | 11/2002 | Balachandran |
| 6,504,875 B2 | 1/2003 | Perino |
| 6,509,773 B2 | 1/2003 | Buchwald |
| 6,522,699 B1 | 2/2003 | Anderson |
| 6,556,628 B1 | 4/2003 | Poulton |
| 6,563,382 B1 | 5/2003 | Yang |
| 6,621,427 B2 | 9/2003 | Greenstreet |
| 6,624,699 B2 | 9/2003 | Yin |
| 6,650,638 B1 | 11/2003 | Walker |
| 6,661,355 B2 | 12/2003 | Cornelius |
| 6,664,355 B2 | 12/2003 | Kim |
| 6,686,879 B2 | 2/2004 | Shattil |
| 6,690,739 B1 | 2/2004 | Mui |
| 6,717,478 B1 | 4/2004 | Kim |
| 6,766,342 B2 | 7/2004 | Kechriotis |
| 6,772,351 B1 | 8/2004 | Werner |
| 6,839,429 B1 | 1/2005 | Gaikwad |
| 6,839,587 B2 | 1/2005 | Yonce |
| 6,854,030 B2 | 2/2005 | Perino |
| 6,865,234 B1 | 3/2005 | Agazzi |
| 6,865,236 B1 | 3/2005 | Terry |
| 6,876,317 B2 | 4/2005 | Sankaran |
| 6,898,724 B2 | 5/2005 | Chang |
| 6,927,709 B2 | 8/2005 | Kiehl |
| 6,954,492 B1 | 10/2005 | Williams |
| 6,963,622 B2 | 11/2005 | Eroz |
| 6,972,701 B2 | 12/2005 | Jansson |
| 6,973,613 B2 | 12/2005 | Cypher |
| 6,976,194 B2 | 12/2005 | Cypher |
| 6,982,954 B2 | 1/2006 | Dhong |
| 6,990,138 B2 | 1/2006 | Bejjani |
| 6,993,311 B2 | 1/2006 | Li |
| 6,999,516 B1 | 2/2006 | Rajan |
| 7,023,817 B2 | 4/2006 | Kuffner |
| 7,039,136 B2 | 5/2006 | Olson |
| 7,053,802 B2 | 5/2006 | Cornelius |
| 7,075,996 B2 | 7/2006 | Simon |
| 7,080,288 B2 | 7/2006 | Ferraiolo |
| 7,082,557 B2 | 7/2006 | Schauer |
| 7,085,153 B2 | 8/2006 | Ferrant |
| 7,085,336 B2 | 8/2006 | Lee |
| 7,127,003 B2 | 10/2006 | Rajan |
| 7,130,944 B2 | 10/2006 | Perino |
| 7,142,612 B2 | 11/2006 | Horowitz |
| 7,142,865 B2 | 11/2006 | Tsai |
| 7,164,631 B2 | 1/2007 | Tateishi |
| 7,167,019 B2 | 1/2007 | Broyde |
| 7,176,823 B2 | 2/2007 | Zabroda |
| 7,180,949 B2 | 2/2007 | Kleveland |
| 7,184,483 B2 | 2/2007 | Rajan |
| 7,199,728 B2 | 4/2007 | Daily |
| 7,231,558 B2 | 6/2007 | Gentieu |
| 7,269,130 B2 | 9/2007 | Pitio |
| 7,269,212 B1 | 9/2007 | Chau |
| 7,335,976 B2 | 2/2008 | Chen |
| 7,336,112 B1 | 2/2008 | Sha |
| 7,339,990 B2 | 3/2008 | Hidaka |
| 7,346,819 B2 | 3/2008 | Bansal |
| 7,348,989 B2 | 3/2008 | Stevens |
| 7,349,484 B2 | 3/2008 | Stojanovic |
| 7,356,213 B1 | 4/2008 | Cunningham |
| 7,358,869 B1 | 4/2008 | Chiarulli |
| 7,362,130 B2 | 4/2008 | Broyde |
| 7,362,697 B2 | 4/2008 | Becker |
| 7,366,942 B2 | 4/2008 | Lee |
| 7,370,264 B2 | 5/2008 | Worley |
| 7,372,390 B2 | 5/2008 | Yamada |
| 7,389,333 B2 | 6/2008 | Moore |
| 7,397,302 B2 | 7/2008 | Bardsley |
| 7,400,276 B1 | 7/2008 | Sotiriadis |
| 7,428,273 B2 | 9/2008 | Foster |
| 7,456,778 B2 | 11/2008 | Werner |
| 7,462,956 B2 | 12/2008 | Lan |
| 7,496,162 B2 | 2/2009 | Srebranig |
| 7,570,704 B2 | 4/2009 | Nagarajan |
| 7,535,957 B2 | 5/2009 | Ozawa |
| 7,539,532 B2 | 5/2009 | Tran |
| 7,599,390 B2 | 10/2009 | Pamarti |
| 7,613,234 B2 | 11/2009 | Raghavan |
| 7,616,075 B2 | 11/2009 | Kushiyama |
| 7,620,116 B2 | 11/2009 | Bessios |
| 7,633,850 B2 | 12/2009 | Nagarajan |
| 7,639,596 B2 | 12/2009 | Cioffi |

(56) References Cited

U.S. PATENT DOCUMENTS

| | | |
|---|---|---|
| 7,643,588 B2 | 1/2010 | Visalli |
| 7,650,525 B1 | 1/2010 | Chang |
| 7,656,321 B2 | 2/2010 | Wang |
| 7,688,929 B2 | 3/2010 | Co |
| 7,694,204 B2 | 4/2010 | Schmidt |
| 7,697,915 B2 | 4/2010 | Behzad |
| 7,698,088 B2 | 4/2010 | Sul |
| 7,706,456 B2 | 4/2010 | Laroia |
| 7,706,524 B2 | 4/2010 | Zerbe |
| 7,746,764 B2 | 6/2010 | Rawlins |
| 7,768,312 B2 | 8/2010 | Hirose |
| 7,787,572 B2 | 8/2010 | Scharf |
| 7,804,361 B2 | 9/2010 | Lim |
| 7,808,456 B2 | 10/2010 | Chen |
| 7,808,883 B2 | 10/2010 | Green |
| 7,841,909 B2 | 11/2010 | Murray |
| 7,860,190 B2 | 12/2010 | Feller |
| 7,869,497 B2 | 1/2011 | Benvenuto |
| 7,869,546 B2 | 1/2011 | Tsai |
| 7,882,413 B2 | 2/2011 | Chen |
| 7,899,653 B2 | 3/2011 | Hollis |
| 7,907,676 B2 | 3/2011 | Stojanovic |
| 7,933,770 B2 | 4/2011 | Kruger |
| 8,000,664 B2 | 8/2011 | Khorram |
| 8,030,999 B2 | 10/2011 | Chatterjee |
| 8,036,300 B2 | 10/2011 | Evans |
| 8,050,332 B2 | 11/2011 | Chung |
| 8,055,095 B2 | 11/2011 | Palotai |
| 8,064,535 B2 | 11/2011 | Wiley |
| 8,085,172 B2 | 12/2011 | Li |
| 8,091,006 B2 | 1/2012 | Prasad |
| 8,106,806 B2 | 1/2012 | Toyomura |
| 8,149,906 B2 | 4/2012 | Saito |
| 8,159,375 B2 | 4/2012 | Abbasfar |
| 8,159,376 B2 | 4/2012 | Abbasfar |
| 8,180,931 B2 | 5/2012 | Lee |
| 8,185,807 B2 | 5/2012 | Oh |
| 8,199,849 B2 | 6/2012 | Oh |
| 8,199,863 B2 | 6/2012 | Chen |
| 8,218,670 B2 | 7/2012 | AbouRjeily |
| 8,233,544 B2 | 7/2012 | Bao |
| 8,245,094 B2 | 8/2012 | Jiang |
| 8,253,454 B2 | 8/2012 | Lin |
| 8,279,094 B2 | 10/2012 | Abbasfar |
| 8,279,745 B2 | 10/2012 | Dent |
| 8,289,914 B2 | 10/2012 | Li |
| 8,295,250 B2 | 10/2012 | Gorokhov |
| 8,295,336 B2 | 10/2012 | Lutz |
| 8,305,247 B2 | 11/2012 | Pun |
| 8,310,389 B1 | 11/2012 | Chui |
| 8,341,492 B2 | 12/2012 | Shen |
| 8,359,445 B2 | 1/2013 | Ware |
| 8,365,035 B2 | 1/2013 | Hara |
| 8,406,315 B2 | 3/2013 | Tsai |
| 8,406,316 B2 | 3/2013 | Sugita |
| 8,429,492 B2 | 4/2013 | Yoon |
| 8,429,495 B2 | 4/2013 | Przybylski |
| 8,437,440 B1 | 5/2013 | Zhang |
| 8,442,099 B1 | 5/2013 | Sederat |
| 8,442,210 B2 | 5/2013 | Zerbe |
| 8,443,223 B2 | 5/2013 | Abbasfar |
| 8,451,913 B2 | 5/2013 | Oh |
| 8,462,891 B2 | 6/2013 | Kizer |
| 8,472,513 B2 | 6/2013 | Malipatil |
| 8,620,166 B2 | 6/2013 | Dong |
| 8,498,344 B2 | 7/2013 | Wilson |
| 8,498,368 B1 | 7/2013 | Husted |
| 8,520,348 B2 | 8/2013 | Dong |
| 8,520,493 B2 | 8/2013 | Goulahsen |
| 8,539,318 B2 | 9/2013 | Cronie |
| 8,547,272 B2 | 10/2013 | Nestler |
| 8,577,284 B2 | 11/2013 | Seo |
| 8,578,246 B2 | 11/2013 | Mittelholzer |
| 8,588,254 B2 | 11/2013 | Diab |
| 8,588,280 B2 | 11/2013 | Oh |
| 8,593,305 B1 | 11/2013 | Tajalli |
| 8,602,643 B2 | 12/2013 | Gardiner |
| 8,604,879 B2 | 12/2013 | Mourant |
| 8,638,241 B2 | 1/2014 | Sudhakaran |
| 8,643,437 B2 | 2/2014 | Chiu |
| 8,649,445 B2 | 2/2014 | Cronie |
| 8,649,460 B2 | 2/2014 | Ware |
| 8,674,861 B2 | 3/2014 | Matsuno |
| 8,687,968 B2 | 4/2014 | Nosaka |
| 8,711,919 B2 | 4/2014 | Kumar |
| 8,718,184 B1 | 5/2014 | Cronie |
| 8,755,426 B1 | 6/2014 | Cronie |
| 8,773,964 B2 | 7/2014 | Hsueh |
| 8,780,687 B2 | 7/2014 | Clausen |
| 8,782,578 B2 | 7/2014 | Tell |
| 8,791,735 B1 | 7/2014 | Shibasaki |
| 8,831,440 B2 | 9/2014 | Yu |
| 8,841,936 B2 | 9/2014 | Nakamura |
| 8,879,660 B1 | 11/2014 | Peng |
| 8,897,134 B2 | 11/2014 | Kern |
| 8,898,504 B2 | 11/2014 | Baumgartner |
| 8,938,171 B2 | 1/2015 | Tang |
| 8,949,693 B2 | 2/2015 | Ordentlich |
| 8,951,072 B2 | 2/2015 | Hashim |
| 8,975,948 B2 | 3/2015 | GonzalezDiaz |
| 8,989,317 B1 | 3/2015 | Holden |
| 9,015,566 B2 | 4/2015 | Cronie |
| 9,020,049 B2 | 4/2015 | Schwager |
| 9,036,764 B1 | 5/2015 | Hossain |
| 9,059,816 B1 | 6/2015 | Simpson |
| 9,069,995 B1 | 6/2015 | Cronie |
| 9,077,386 B1 | 7/2015 | Holden |
| 9,083,576 B1 | 7/2015 | Hormati |
| 9,093,791 B2 | 7/2015 | Liang |
| 9,100,232 B1 | 8/2015 | Hormati |
| 9,106,465 B2 | 8/2015 | Walter |
| 9,124,557 B2 | 9/2015 | Fox |
| 9,148,087 B1 | 9/2015 | Tajalli |
| 9,148,198 B1 | 9/2015 | Zhang |
| 9,152,495 B2 | 10/2015 | Losh |
| 9,165,615 B2 | 10/2015 | Amirkhany |
| 9,172,412 B2 | 10/2015 | Kim |
| 9,178,503 B2 | 11/2015 | Hsieh |
| 9,183,085 B1 | 11/2015 | Northcott |
| 9,197,470 B2 | 11/2015 | Okunev |
| 9,281,785 B2 | 3/2016 | Sjoland |
| 9,288,082 B1 | 3/2016 | Ulrich |
| 9,288,089 B2 | 3/2016 | Cronie |
| 9,292,716 B2 | 3/2016 | Winoto |
| 9,300,503 B1 | 3/2016 | Holden |
| 9,306,621 B2 | 4/2016 | Zhang |
| 9,331,962 B2 | 5/2016 | Lida |
| 9,362,974 B2 | 6/2016 | Fox |
| 9,363,114 B2 | 6/2016 | Shokrollahi |
| 9,374,250 B1 | 6/2016 | Musah |
| 9,397,868 B1 | 7/2016 | Hossain et al. |
| 9,401,828 B2 | 7/2016 | Cronie |
| 9,432,082 B2 | 8/2016 | Ulrich |
| 9,432,298 B1 | 8/2016 | Smith |
| 9,438,409 B1 | 9/2016 | Liao et al. |
| 9,444,654 B2 | 9/2016 | Hormati |
| 9,455,744 B2 | 9/2016 | George |
| 9,455,765 B2 | 9/2016 | Schumacher |
| 9,461,862 B2 | 10/2016 | Holden |
| 9,479,369 B1 | 10/2016 | Shokrollahi |
| 9,509,437 B2 | 11/2016 | Shokrollahi |
| 9,520,883 B2 | 12/2016 | Shibasaki |
| 9,544,015 B2 | 1/2017 | Ulrich |
| 9,565,036 B2 | 2/2017 | Zerbe |
| 9,577,815 B1 | 2/2017 | Simpson et al. |
| 9,634,797 B2 | 4/2017 | Benammar |
| 9,667,379 B2 | 5/2017 | Cronie |
| 9,906,358 B1 | 2/2018 | Tajalli |
| 9,960,902 B1 | 5/2018 | Lin et al. |
| 10,055,372 B2 | 8/2018 | Shokrollahi |
| 2001/0006538 A1 | 7/2001 | Simon |
| 2001/0055344 A1 | 12/2001 | Lee |
| 2002/0034191 A1 | 3/2002 | Shattil |
| 2002/0044316 A1 | 4/2002 | Myers |

(56) References Cited

U.S. PATENT DOCUMENTS

| | | |
|---|---|---|
| 2002/0057592 A1 | 5/2002 | Robb |
| 2002/0154633 A1 | 10/2002 | Shin |
| 2002/0163881 A1 | 11/2002 | Dhong |
| 2002/0167339 A1 | 11/2002 | Chang |
| 2002/0174373 A1 | 11/2002 | Chang |
| 2002/0181607 A1 | 12/2002 | Izumi |
| 2003/0001557 A1 | 1/2003 | Pisipaty |
| 2003/0016763 A1 | 1/2003 | Doi |
| 2003/0016770 A1 | 1/2003 | Trans |
| 2003/0046618 A1 | 3/2003 | Collins |
| 2003/0085763 A1 | 5/2003 | Schrodinger |
| 2003/0146783 A1 | 8/2003 | Bandy |
| 2003/0174023 A1 | 9/2003 | Miyasita |
| 2003/0185310 A1 | 10/2003 | Ketchum |
| 2003/0218558 A1 | 11/2003 | Mulder |
| 2004/0027185 A1 | 2/2004 | Fiedler |
| 2004/0092240 A1 | 5/2004 | Hayashi |
| 2004/0146117 A1 | 7/2004 | Subramaniam |
| 2004/0155802 A1 | 8/2004 | Lamy |
| 2004/0161019 A1 | 8/2004 | Raghavan |
| 2004/0169529 A1 | 9/2004 | Afghahi |
| 2005/0024117 A1 | 2/2005 | Kubo |
| 2005/0063493 A1 | 3/2005 | Foster |
| 2005/0084050 A1 | 4/2005 | Cheung et al. |
| 2005/0117404 A1 | 6/2005 | Savoj |
| 2005/0128018 A1 | 6/2005 | Meltzer |
| 2005/0134380 A1 | 6/2005 | Nairn |
| 2005/0174841 A1 | 8/2005 | Ho |
| 2005/0195000 A1 | 9/2005 | Parker |
| 2005/0201491 A1 | 9/2005 | Wei |
| 2005/0213686 A1 | 9/2005 | Love |
| 2005/0220182 A1 | 10/2005 | Kuwata |
| 2005/0270098 A1 | 12/2005 | Zhang |
| 2005/0275470 A1 | 12/2005 | Choi |
| 2006/0036668 A1 | 2/2006 | Jaussi |
| 2006/0097786 A1 | 5/2006 | Su |
| 2006/0103463 A1 | 5/2006 | Lee |
| 2006/0120486 A1 | 6/2006 | Visalli |
| 2006/0126751 A1 | 6/2006 | Bessios |
| 2006/0133538 A1 | 6/2006 | Stojanovic |
| 2006/0140324 A1 | 6/2006 | Casper |
| 2006/0159005 A1 | 7/2006 | Rawlins |
| 2006/0192598 A1* | 8/2006 | Baird .................. H03L 7/099 327/100 |
| 2006/0232461 A1 | 10/2006 | Felder |
| 2006/0233291 A1 | 10/2006 | Garlepp |
| 2006/0291589 A1 | 12/2006 | Eliezer |
| 2007/0001713 A1 | 1/2007 | Lin |
| 2007/0001723 A1 | 1/2007 | Lin |
| 2007/0002954 A1 | 1/2007 | Cornelius |
| 2007/0030796 A1 | 2/2007 | Green |
| 2007/0047689 A1* | 3/2007 | Menolfi .................. H03D 3/006 375/376 |
| 2007/0076871 A1 | 4/2007 | Renes |
| 2007/0103338 A1 | 5/2007 | Teo |
| 2007/0121716 A1 | 5/2007 | Nagarajan |
| 2007/0147559 A1 | 6/2007 | Lapointe |
| 2007/0182487 A1 | 8/2007 | Ozasa |
| 2007/0201546 A1 | 8/2007 | Lee |
| 2007/0201597 A1 | 8/2007 | He |
| 2007/0204205 A1 | 8/2007 | Niu |
| 2007/0263711 A1 | 11/2007 | Kramer |
| 2007/0283210 A1 | 12/2007 | Prasad |
| 2008/0007367 A1 | 1/2008 | Kim |
| 2008/0012598 A1 | 1/2008 | Mayer |
| 2008/0104374 A1 | 5/2008 | Mohamed |
| 2008/0159448 A1 | 7/2008 | Anim-Appiah |
| 2008/0165841 A1 | 7/2008 | Wall et al. |
| 2008/0192621 A1 | 8/2008 | Suehiro |
| 2008/0317188 A1 | 12/2008 | Staszewski |
| 2009/0059782 A1 | 3/2009 | Cole |
| 2009/0103675 A1 | 4/2009 | Yousefi et al. |
| 2009/0115523 A1 | 5/2009 | Akizuki |
| 2009/0154604 A1 | 6/2009 | Lee |
| 2009/0167389 A1* | 7/2009 | Reis .................. H03L 7/099 327/159 |
| 2009/0195281 A1 | 8/2009 | Tamura |
| 2009/0262876 A1 | 10/2009 | Arima |
| 2009/0316730 A1 | 12/2009 | Feng |
| 2009/0323864 A1 | 12/2009 | Tired |
| 2010/0046644 A1 | 2/2010 | Mazet |
| 2010/0081451 A1 | 4/2010 | Mueck |
| 2010/0148819 A1 | 6/2010 | Bae |
| 2010/0180143 A1 | 7/2010 | Ware |
| 2010/0215087 A1 | 8/2010 | Tsai |
| 2010/0215112 A1 | 8/2010 | Tsai |
| 2010/0220828 A1 | 9/2010 | Fuller |
| 2010/0235673 A1 | 9/2010 | Abbasfar |
| 2010/0271107 A1 | 10/2010 | Tran |
| 2010/0283894 A1 | 11/2010 | Horan |
| 2010/0296556 A1 | 11/2010 | Rave |
| 2010/0309964 A1 | 12/2010 | Oh |
| 2011/0002181 A1 | 1/2011 | Wang et al. |
| 2011/0014865 A1 | 1/2011 | Seo |
| 2011/0028089 A1 | 2/2011 | Komori |
| 2011/0032977 A1 | 2/2011 | Hsiao |
| 2011/0051854 A1 | 3/2011 | Kizer |
| 2011/0072330 A1 | 3/2011 | Kolze |
| 2011/0074488 A1 | 3/2011 | Broyde |
| 2011/0084737 A1 | 4/2011 | Oh |
| 2011/0103508 A1 | 5/2011 | Mu |
| 2011/0127990 A1 | 6/2011 | Wilson |
| 2011/0156757 A1 | 6/2011 | Hayashi |
| 2011/0228864 A1 | 9/2011 | Aryanfar |
| 2011/0235501 A1 | 9/2011 | Goulahsen |
| 2011/0268225 A1 | 11/2011 | Cronie |
| 2011/0299555 A1 | 12/2011 | Cronie |
| 2011/0302478 A1 | 12/2011 | Cronie |
| 2011/0311008 A1 | 12/2011 | Slezak et al. |
| 2011/0317559 A1 | 12/2011 | Kern |
| 2012/0082203 A1 | 4/2012 | Zerbe |
| 2012/0133438 A1 | 5/2012 | Tsuchi |
| 2012/0152901 A1 | 6/2012 | Nagorny |
| 2012/0161945 A1 | 6/2012 | Single |
| 2012/0206177 A1 | 8/2012 | Colinet et al. |
| 2012/0213299 A1 | 8/2012 | Cronie |
| 2012/0257683 A1 | 10/2012 | Schwager |
| 2012/0327993 A1 | 12/2012 | Palmer |
| 2013/0010892 A1 | 1/2013 | Cronie |
| 2013/0013870 A1 | 1/2013 | Cronie |
| 2013/0088274 A1 | 4/2013 | Gu |
| 2013/0091392 A1 | 4/2013 | Valliappan et al. |
| 2013/0106513 A1 | 5/2013 | Cyrusian |
| 2013/0114519 A1 | 5/2013 | Gaal |
| 2013/0114663 A1 | 5/2013 | Ding |
| 2013/0129019 A1 | 5/2013 | Sorrells |
| 2013/0147553 A1 | 6/2013 | Iwamoto |
| 2013/0188656 A1 | 7/2013 | Ferraiolo |
| 2013/0195155 A1 | 8/2013 | Pan |
| 2013/0202065 A1 | 8/2013 | Chmelar |
| 2013/0207706 A1 | 8/2013 | Yanagisawa |
| 2013/0215954 A1 | 8/2013 | Beukema |
| 2013/0259113 A1 | 10/2013 | Kumar |
| 2013/0271194 A1 | 10/2013 | Pellerano |
| 2013/0285720 A1 | 10/2013 | Jibry |
| 2013/0307614 A1 | 11/2013 | Dai |
| 2013/0314142 A1 | 11/2013 | Tamura |
| 2013/0315501 A1 | 11/2013 | Atanassov |
| 2013/0346830 A1 | 12/2013 | Ordentlich |
| 2014/0159769 A1 | 6/2014 | Hong |
| 2014/0177645 A1 | 6/2014 | Cronie |
| 2014/0177696 A1 | 6/2014 | Hwang |
| 2014/0266440 A1 | 9/2014 | Itagaki |
| 2014/0269130 A1 | 9/2014 | Maeng |
| 2014/0286381 A1 | 9/2014 | Shibasaki |
| 2015/0049798 A1 | 2/2015 | Hossein |
| 2015/0070201 A1 | 3/2015 | Dedic |
| 2015/0078479 A1 | 3/2015 | Whitby-Strevens |
| 2015/0078495 A1 | 3/2015 | Hossain |
| 2015/0117579 A1 | 4/2015 | Shibasaki |
| 2015/0146771 A1 | 5/2015 | Walter |
| 2015/0180642 A1 | 6/2015 | Hsieh |
| 2015/0220472 A1 | 8/2015 | Sengoku |

(56) References Cited

U.S. PATENT DOCUMENTS

| | | |
|---|---|---|
| 2015/0222458 A1 | 8/2015 | Hormati |
| 2015/0249559 A1 | 9/2015 | Shokrollahi |
| 2015/0256326 A1 | 9/2015 | Simpson et al. |
| 2015/0333940 A1 | 11/2015 | Shokrollahi |
| 2015/0349835 A1 | 12/2015 | Fox |
| 2015/0380087 A1 | 12/2015 | Mittelholzer |
| 2015/0381232 A1 | 12/2015 | Ulrich |
| 2016/0020796 A1 | 1/2016 | Hormati |
| 2016/0020824 A1 | 1/2016 | Ulrich |
| 2016/0036616 A1 | 2/2016 | Holden |
| 2016/0056980 A1 | 2/2016 | Wang et al. |
| 2016/0134267 A1 | 5/2016 | Adachi |
| 2016/0197747 A1 | 7/2016 | Ulrich |
| 2016/0261435 A1 | 9/2016 | Musah |
| 2017/0310456 A1 | 10/2017 | Tajalli |
| 2017/0317449 A1 | 11/2017 | Shokrollahi |
| 2017/0317855 A1 | 11/2017 | Shokrollahi |
| 2018/0375693 A1 | 12/2018 | Zhou et al. |

FOREIGN PATENT DOCUMENTS

| | | |
|---|---|---|
| CN | 101478286 | 7/2009 |
| CN | 203675093 U | 6/2014 |
| EP | 0740423 A2 | 10/1996 |
| EP | 1926267 | 5/2008 |
| EP | 2039221 | 2/2013 |
| JP | 2003163612 | 6/2003 |
| WO | 2005002162 | 1/2005 |
| WO | 2009084121 | 7/2009 |
| WO | 2010031824 | 3/2010 |
| WO | 2011119359 | 9/2011 |

OTHER PUBLICATIONS

Abbasfar, A., "Generalized Differential Vector Signaling", IEEE International Conference on Communications, ICC '09, (Jun. 14, 2009), pp. 1-5.

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Burr, "Spherical Codes for M-ARY Code Shift Keying", University of York, Apr. 2, 1989, pp. 67-72, United Kingdom.

Cheng, W., "Memory Bus Encoding for Low Power: A Tutorial", Quality Electronic Design, IEEE, International Symposium on Mar. 26-28, 2001, pp. 199-204, Piscataway, NJ.

Clayton, P., "Introduction to Electromagnetic Compatibility", Wiley-Interscience, 2006.

Counts, L., et al., "One-Chip Slide Rule Works with Logs, Antilogs for Real-Time Processing," Analog Devices Computational Products 6, Reprinted from Electronic Design, May 2, 1985, 7 pages.

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.

Design Brief 208 Using the Anadigm Multiplier CAM, Copyright 2002 Anadigm, 6 pages.

Ericson, T., et al., "Spherical Codes Generated by Binary Partitions of Symmetric Pointsets", IEEE Transactions on Information Theory, vol. 41, No. 1, Jan. 1995, pp. 107-129.

Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.

Grahame, J., "Vintage Analog Computer Kits," posted on Aug. 25, 2006 in Classic Computing, 2 pages, http.//www.retrothing.com/2006/08/classic_analog_.html.

Healey, A., et al., "A Comparison of 25 Gbps NRZ & PAM-4 Modulation used in Legacy & Premium Backplane Channels", DesignCon 2012, 16 pages.

International Search Report and Written Opinion for PCT/EP2011/059279 dated Sep. 22, 2011.

International Search Report and Written Opinion for PCT/EP2011/074219 dated Jul. 4, 2012.

International Search Report and Written Opinion for PCT/EP2012/052767 dated May 11, 2012.

International Search Report and Written Opinion for PCT/US14/052986 dated Nov. 24, 2014.

International Search Report and Written Opinion from PCT/US2014/034220 dated Aug. 21, 2014.

International Search Report and Written Opinion of the International Searching Authority, dated Jul. 14, 2011 in International Patent Application S.N. PCT/EP2011/002170, 10 pages.

International Search Report and Written Opinion of the International Searching Authority, dated Nov. 5, 2012, in International Patent Application S.N. PCT/EP2012/052767, 7 pages.

International Search Report for PCT/US2014/053563, dated Nov. 11, 2014, 2 pages.

Jiang, A., et al., "Rank Modulation for Flash Memories", IEEE Transactions of Information Theory, Jun. 2006, vol. 55, No. 6, pp. 2659-2673.

Loh, M., et al., "A 3×9 Gb/s Shared, All-Digital CDR for High-Speed, High-Density I/O", Matthew Loh, IEEE Journal of Solid-State Circuits, Vo. 47, No. 3, Mar. 2012.

Notification of Transmittal of International Search Report and the Written Opinion of the International Searching Authority, for PCT/US2015/018363, dated Jun. 18, 2015, 13 pages.

Notification of Transmittal of the International Search Report and the Written Opinion of the International Searching Authority, or the Declaration for PCT/EP2013/002681, dated Feb. 25, 2014, 15 pages.

Notification of Transmittal of the International Search Report and the Written Opinion of the International Searching Authority, or the Declaration, dated Mar. 3, 2015, for PCT/US2014/066893, 9 pages.

Notification of Transmittal of the International Search Report and the Written Opinion of the International Searching Authority, or the Declaration, for PCT/US2014/015840, dated May 20, 2014. 11 pages.

Notification of Transmittal of the International Search Report and the Written Opinion of the International Searching Authority, or the Declaration, for PCT/US2014/043965, dated Oct. 22, 2014, 10 pages.

Notification of Transmittal of the International Search Report and the Written Opinion of the International Searching Authority, or the Declaration, for PCT/US2015/037466, dated Nov. 19, 2015.

Notification of Transmittal of the International Search Report and the Written Opinion of the International Searching Authority, or the Declaration, for PCT/US2015/039952, dated Sep. 23, 2015, 8 pages.

Notification of Transmittal of the International Search Report and the Written Opinion of the International Searching Authority, or the Declaration, for PCT/US2015/041161, dated Oct. 7, 2015, 8 pages.

Notification of Transmittal of the International Search Report and the Written Opinion of the International Searching Authority, or the Declaration, for PCT/US2015/043463, dated Oct. 16, 2015, 8 pages.

Oh, et al., Pseudo-Differential Vector Signaling for Noise Reduction in Single-Ended Signaling, DesignCon 2009.

Poulton, et al., "Multiwire Differential Signaling", UNC-CH Department of Computer Science Version 1.1, Aug. 6, 2003.

Schneider, J., et al., "ELEC301 Project: Building an Analog Computer," Dec. 19, 1999, 8 pages, http://www.clear.rice.edu/elec301/Projects99/anlgcomp/.

She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.

Skliar et al., A Method for the Analysis of Signals: the Square-Wave Method, Mar. 2008, Revista de Matematica: Teoria y Aplicationes, pp. 109-129.

Slepian, D., "Premutation Modulation", IEEE, vol. 52, No. 3, Mar. 1965, pp. 228-236.

(56) References Cited

OTHER PUBLICATIONS

Stan, M., et al., "Bus-Invert Coding for Low-Power I/O, IEEE Transactions on Very Large Scale Integration (VLSI) Systems", vol. 3, No. 1, Mar. 1995, pp. 49-58.

Tallini, L., et al., "Transmission Time Analysis for the Parallel Asynchronous Communication Scheme", IEEE Transactions on Computers, vol. 52, No. 5, May 2003, pp. 558-571.

Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.

Wang et al., "Applying CDMA Technique to Network-on-Chip", IEEE Transactions on Very Large Scale Integration (VLSI) Systems, vol. 15, No. 10 (Oct. 1, 2007), pp. 1091-1100.

Zouhair Ben-Neticha et al, "The 'streTched-Golay and other codes for high-SNR fnite-delay quantization of the Gaussian source at 1/2 Bit per sample", IEEE Transactions on Communications, vol. 38, No. 12 Dec. 1, 1990, pp. 2089-2093, XP000203339, ISSN: 0090-6678, DOI: 10.1109/26.64647.

Notification of Transmittal of the International Search Report and the Written Opinion of the International Searching Authority, or the Declaration, dated Feb. 15, 2017, 10 pages.

Notification of Transmittal of the International Search Report and the Written Opinion of the International Searching Authority, or the Declaration., for PCT/US17/14997, dated Apr. 7, 2017.

Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/13_09/holden_400_01_0913.pdf.

Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.

Holden, B., "Using Ensemble NRZ Coding for 400GE Electrical Interfaces", IEEE 802.3 400GE Study Group, May 17, 2013, 24 pages, http://www.ieee802.org/3/400GSG/public/13_05/holden_400_01_0513.pdf.

Farzan, et al., "Coding Schemes for Chip-to-Chip Interconnect Applications", IEEE Transactions on Very Large Scale Integration (VLSI) Systems, vol. 14, pp. 393-406, Apr. 2006.

Anonymous, "Constant-weight code", Wikipedia.org, retrieved on Jun. 2, 2017.

Reza Navid et al, "A 40 Gb/s Serial Link Transceiver in 28 nm CMOS Technology", IEEE Journal of Solid-State Circuits, vol. 50, No. 4. Apr. 2015, pp. 814-827.

Linten, D. et al, "T-Diodes—A Novel Plus-and-Play Wideband RF Circuit ESD Protection Methodology" EOS/ESD Symposium 07, pp. 242-249.

Hyosup Won et al, "A 28-Gb/s Receiver With Self-contained Adaptive Equalization and Sampling Point Control Using Stochastic Sigma-Tracking Eye-Opening Monitor", IEEE Transactions on Circuits and Systems-I: Regular Papers, vol. 64, No. 3, Mar. 2017. pp. 664-674.

Giovaneli, et al., "Space-frequency coded OFDM system for multi-wire power line communications", Power Line Communications and Its Applications, 20015 International Symposium on Vancouver, BC, Canada, Apr. 6-8, 2005, Piscataway, NJ, pp. 191-195.

\* cited by examiner

DYNAMICALLY WEIGHTED EXCLUSIVE OR GATE HAVING WEIGHTED OUTPUT SEGMENTS FOR PHASE DETECTION AND PHASE INTERPOLATION

REFERENCES

The following prior applications are herein incorporated by reference in their entirety for all purposes:

U.S. patent application Ser. No. 15/494,439, filed Apr. 21, 2017, naming Armin Tajalli, entitled "High Performance Phase Locked Loop", hereinafter identified as [Tajalli I].

U.S. patent application Ser. No. 15/602,080, filed May 22, 2017, naming Armin Tajalli, entitled "Data-Driven Phase Detector Element for PLL", hereinafter identified as [Tajalli II].

FIELD OF THE INVENTION

The present embodiments relate to communications systems circuits generally, and more particularly to utilization of a Phase-Locked Loop to obtain a stable, correctly phased receiver clock signal from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device must be sampled (or their signal value otherwise recorded) at intervals best representing the original transmitted values, regardless of transmission channel delays, interference, and noise. This Clock and Data Recovery (CDR) not only must determine the appropriate sample timing, but must continue to do so continuously, providing dynamic compensation for varying signal propagation conditions. Many known CDR systems utilize a Phase-Locked Loop (PLL) or Delay-Locked Loop (DLL) to synthesize a local receive clock having an appropriate frequency and phase for accurate receive data sampling.

BRIEF DESCRIPTION

Methods and systems are described for receiving a reference clock signal and a phase of a local oscillator signal at a dynamically-weighted XOR gate comprising a plurality of logic branches, generating a plurality of weighted segments of a phase-error signal, the plurality of weighted segments comprising (i) positive weighted segments generated by a first subset of the plurality of logic branches when the reference clock signal and the phase of the local oscillator signal have equal logic levels and (ii) negative weighted segments generated by a second subset of the plurality of logic branches when the reference clock signal and the phase of the local oscillator signal have different logic levels, each weighted segment of the phase-error signal having a respective weight applied by a corresponding logic branch of the plurality of logic branches, generating an aggregate control signal based on an aggregation of the weighted segments of the phase-error signal, and outputting the aggregate control signal as a current-mode output for controlling a local oscillator generating the phase of the local oscillator signal, the local oscillator configured to induce a phase offset into the local oscillator signal in response to the aggregate control signal.

To reliably detect the data values transmitted over a communications system, a receiver must accurately measure the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream.

In general, the receiver embodiments of such timing methods incorporate some form of Clock Data Recovery (CDR), often based on Phase-Lock Loop (PLL) or Delay-Locked Loop (DLL) synthesis of a local receive clock having the desired frequency and phase characteristics. In these embodiments, a Phase Detector compares the relative phase (and in some variations, the relative frequency) of a received reference signal and a local clock signal to produce an error signal, which is subsequently used to correct the phase and/or frequency of the local clock source and thus minimize the error.

[Tajalli I] and [Tajalli II] describe embodiments in which multiple phases or time-offset instances of the received reference clock and/or the local clock are produced and phase compared, allowing additional timing information to be extracted. In such so-called "matrix" phase comparisons, a summation or weighted summation of the multiple phase comparison results is used as the error feedback signal for the PLL. Embodiments described herein combine phase detection functions with adjustable or configurable output weighting, facilitating use in matrix phase comparison.

DETAILED DESCRIPTION

The current state of the art for short-distance wired data communication, such as between integrated circuits on a printed circuit board, exceeds 10 Gbps per wire, for a multiple-wire parallel communications channel. These considerable data rates demand accurate timing control, especially for the timing of the receiver data sampling operation. [Tajalli I] and [Tajalli II] describe generation of such timing clocks using Phase-Locked Loop (PLL) or Delay-Locked Loop (DLL) systems incorporating "matrix" phase comparison operations, in which multiple comparison results between different reference and local clock phases are performed, with the summed result providing a more accurate or informative measure of clock error.

Figure 1:
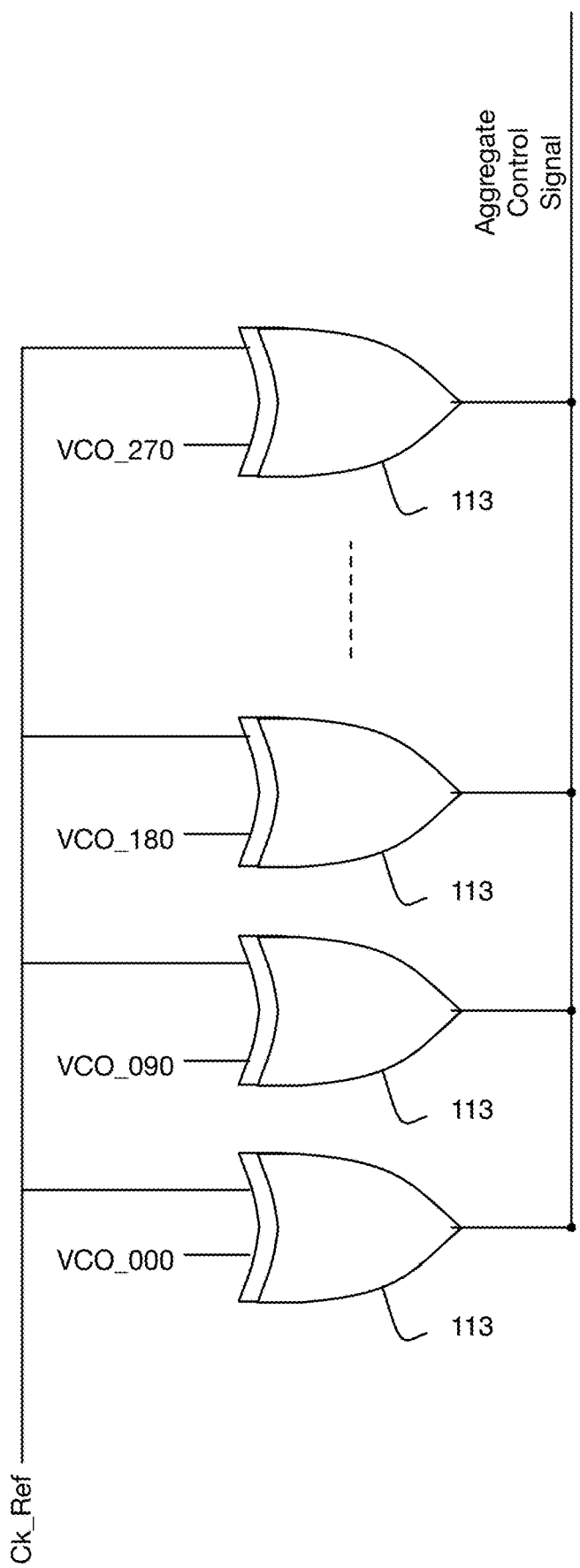
FIG. 1 shows multiple XOR gates functioning as phase comparators between reference clock signal Ck_Ref and phases of the local oscillator signal including phases VCO_000, VCO_090, VCO_180, VCO_270, generating an aggregate control signal.

Numerous forms of phase detectors are known to the art. A simple XOR or XNOR gate may be used to compare, as a non-limiting example, two square wave signals. One familiar with the art will observe that such a digital XOR output will be a variable-duty-cycle waveform which, when low pass filtered into an analog error signal, results in a proportional error signal centered in its analog signal range when the two input signals have a 90-degree phase offset relationship. In FIG. 1, multiple dynamically-weighted XOR phase comparisons are made between reference clock signal Ck_Ref and phases of a local oscillator signal including phases VCO_000, VCO_090, VCO_180, VCO_270, resulting in an aggregate control signal. As taught by [Tajalli I] and [Tajalli II], appropriate adjustment of the weights of the various phase error components may be used to adjust the resulting lock phase of the PLL incorporating the matrix phase comparator, introduce additional poles or zeroes into the closed-loop PLL response, etc.

Figure 3:
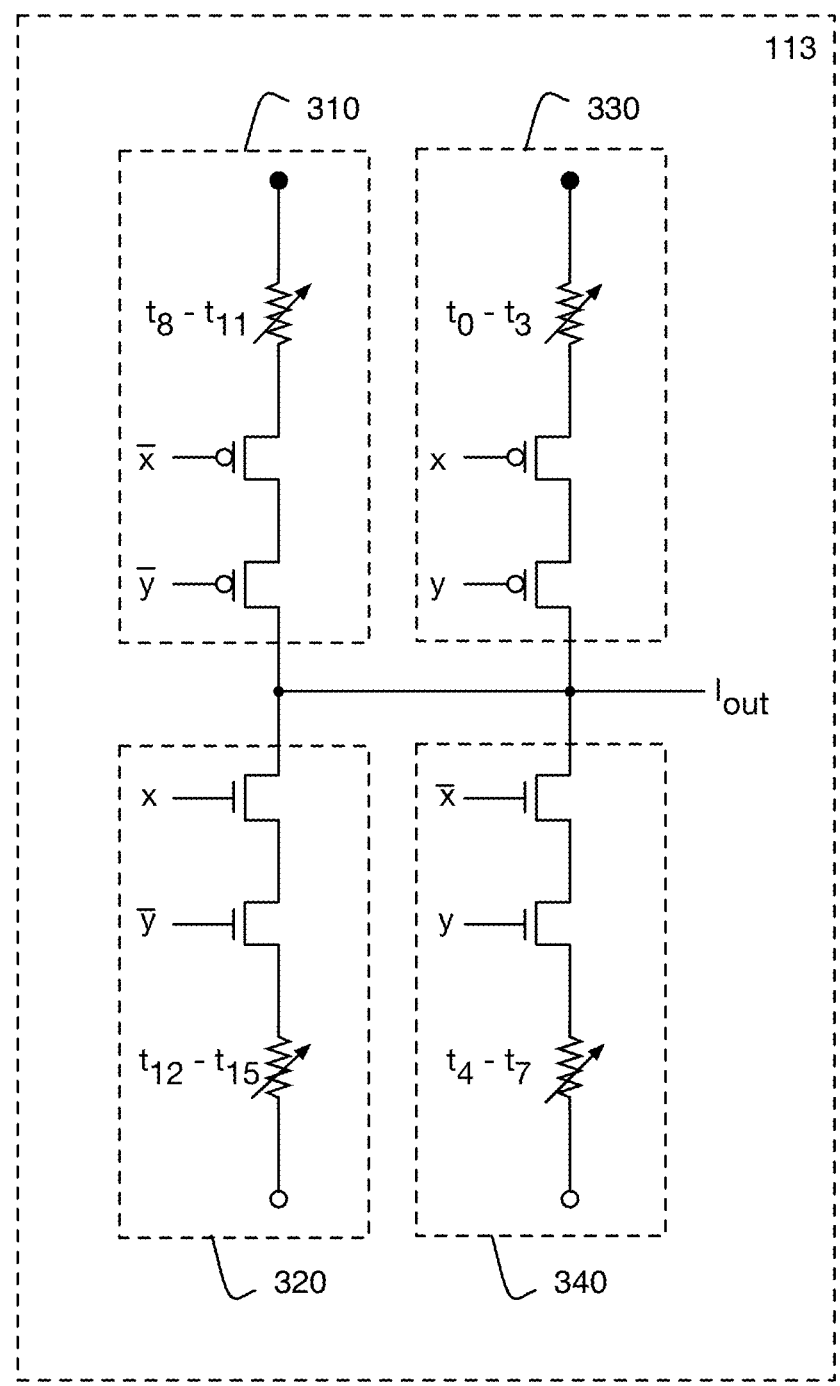
FIG. 3 is a schematic diagram of one embodiment of a dynamically-weighted XOR gate, in which each gate branch is configurable to produce a weighted segment of a phase-error signal.

[Tajalli I] and [Tajalli II] additionally disclose that a digital XOR or XNOR gate may be decomposed into a transistor-level gate including sub-elements representing component AND operations subsequently ORed together to implement the desired composite function. Embodiments are described herein in which each such sub-element may be separately weighted so as to produce a more finely adjustable phase-error signal, that may be further combined with phase-error signals from other dynamically-weighted XOR gates receiving different phases of the local oscillator signal to generate the aggregate control signal, thus providing an interpolation. FIG. 3 is one example of this technique, where XOR gate 113 has been decomposed into individual AND terms 310, 320, 330, 340, each including a resistive weighting element, and all of which are ORed together to produce an aggregate control signal Iout that may be used for controlling phase adjustments in a local oscillator. Following standard practice for CMOS logic, NMOS sub-elements 320 and 340 implement the active-low function components $\overline{\text{Iout}}=(x \cdot \overline{y})+(\overline{x} \cdot y)$ and PMOS sub-elements 310 and 330 implement the active-high function components Iout=$(\overline{x} \cdot \overline{y})+(x \cdot y)$. Thus, the resulting phase-error signal output from gate 113 is composed of both positive-weighted (active-high) and negative-weighted (active-low) segments, allowing both active sourcing and sinking of output current.

Figure 4A:
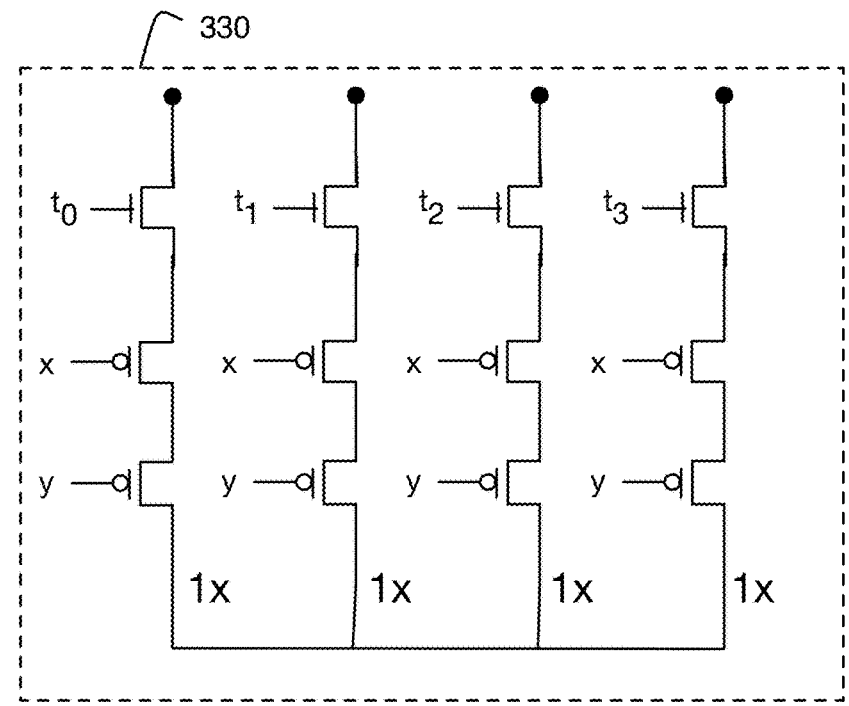
FIGS. 4A and 4B are schematic diagrams of dynamically-weighted XOR gate embodiments incorporating clocked weighting functions.
Figure 4B:
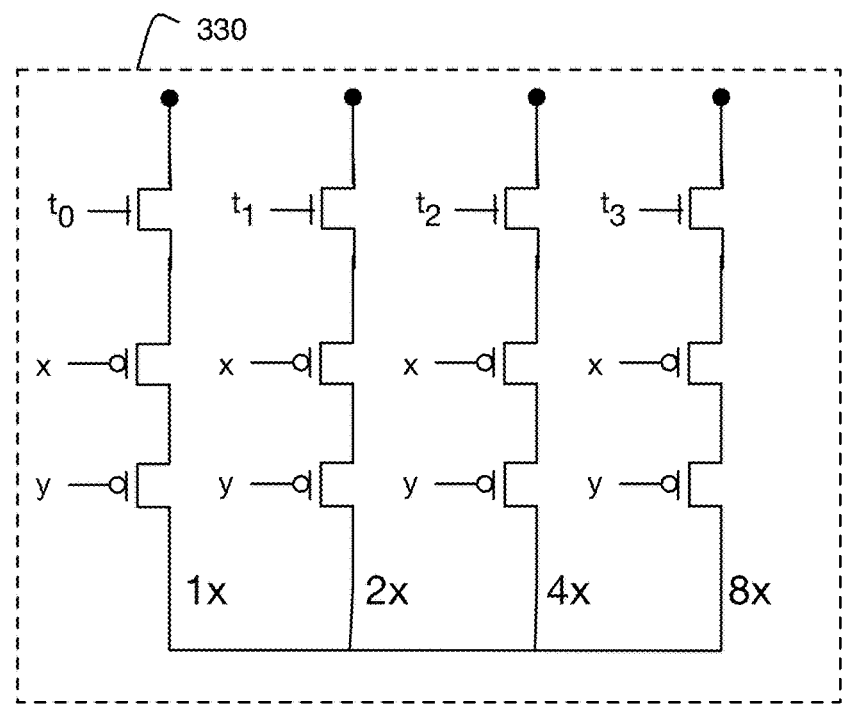

FIGS. 4A and 4B illustrate further embodiments, in which configuration of the weighting operations for a decomposed gate such as that of FIG. 3 is performed by enabling input bits $t_0$, $t_1$, $t_2$, $t_3$, rather than by configurable analog resistances. Specifically, they illustrate two versions of 330 in FIG. 3, with quadrants 310, 320, 340 being implemented in similar fashion. Enabling each of input bits $t_0$, $t_1$, $t_2$, $t_3$ turns on an enabling transistor in one of multiple parallel branch segments or paths, each contributing a fixed amount of current to result K. Thus, the number of such branch segments being enabled controls the overall amplitude, that is, weighting, of the overall result Iout. In a practical embodiment, the amount of current in each path may be controlled by appropriate selection of transistor geometry, as is well known in the art. As two examples offered without implying limitation, FIG. 4A shows transistor geometry chosen such that each parallel path contributes an equal amount of current, while FIG. 4B shows transistor geometry chosen such that current contributions double for consecutive parallel paths. Thus, the embodiment of FIG. 4A might be combined with unary (i.e. counting number) selection of input bits $t_0$, $t_1$, $t_2$, $t_3$ using e.g., a thermometer code, while FIG. 4B may be combined with a binary number representation of input bits $t_0$, $t_1$, $t_2$, $t_3$.

Figure 5:
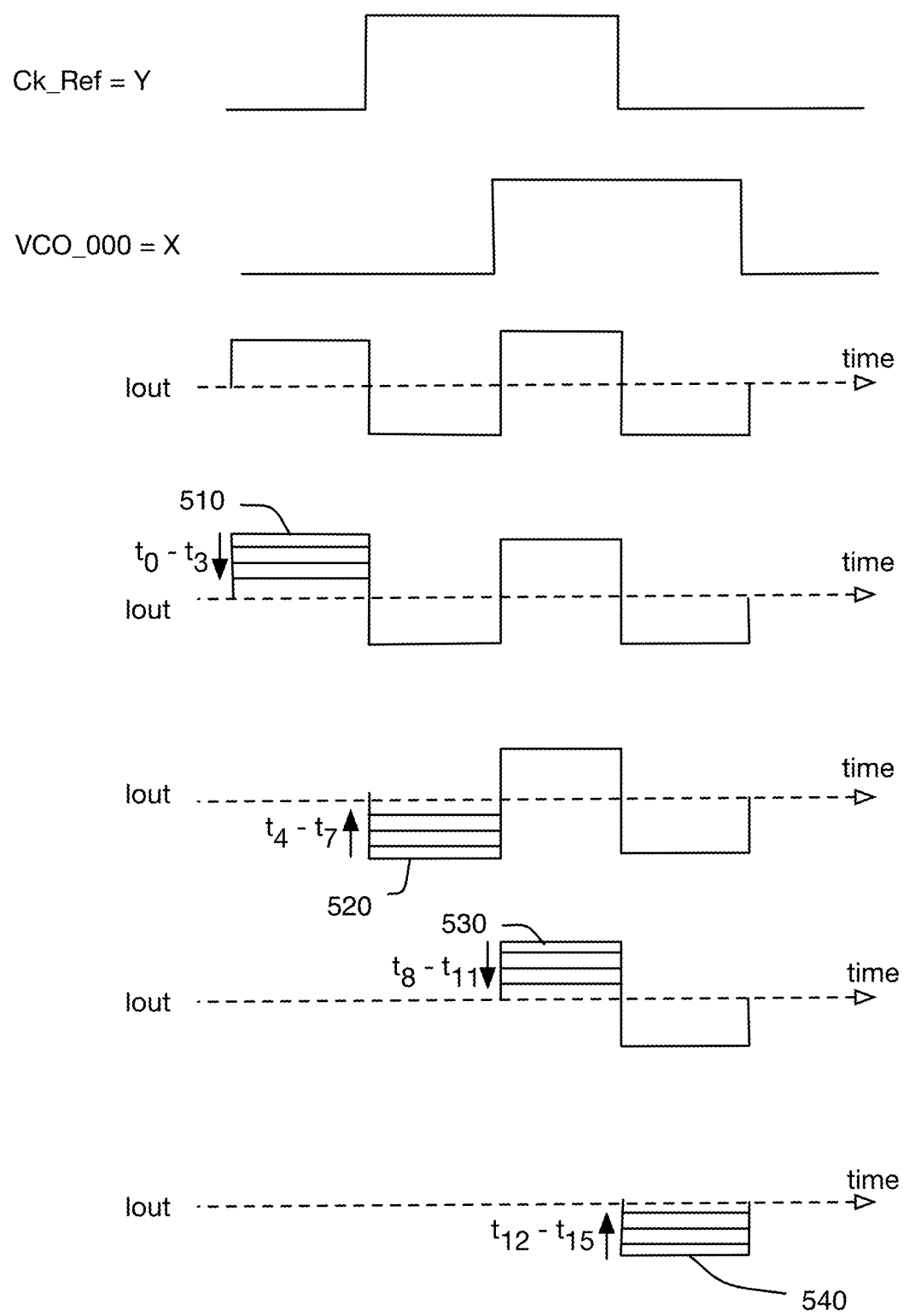
FIG. 5 is a timing diagram illustrating operation of the output weighting function.

FIG. 5 illustrates the results of utilizing the circuit of FIG. 4A in each quadrant of FIG. 3. Enabling one, two, three, or all of $t_0$, $t_1$, $t_2$, $t_3$ in 330 permits weighting of signal amplitude of weighted segment 510. Similar adjustment in 340 allows configuration as shown by weighted segment 520, adjustment of 310 allows configuration as shown by weighted segment 530, and adjustment in 320 allows configuration as shown by weighted segment 540. In this example using four branch segments paths per branch, a total of sixteen possible signal amplitudes may be obtained for the combined output Iout. In some embodiments, additional constraints may be applied, for example to maintain signal symmetry by always enabling equal numbers of PMOS and NMOS (i.e. positive weighted and negative weighted) branch segments.

Figure 2:
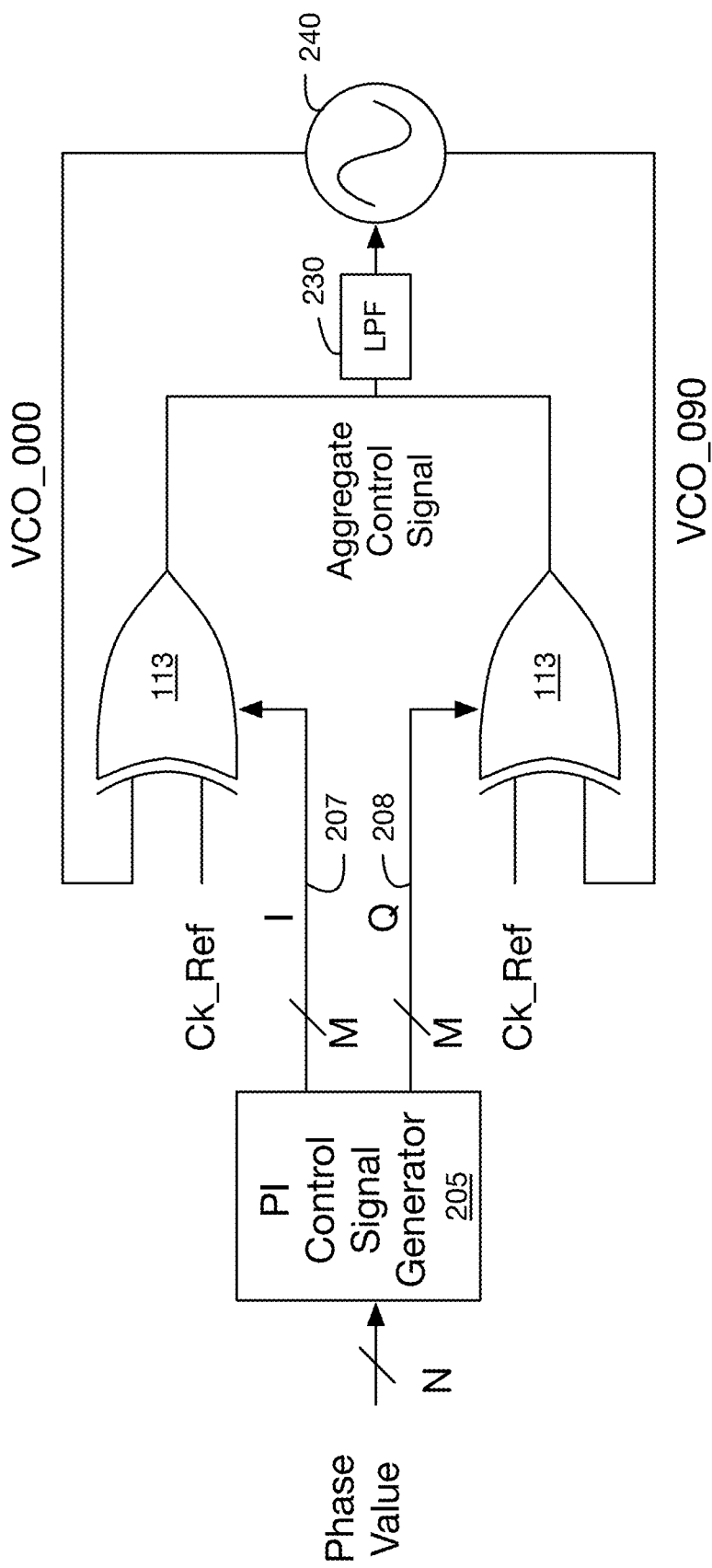
FIG. 2 is a block diagram of one embodiment of a phase control loop comparing phases VCO_000 and VCO_090 of the local oscillator signal to Ck_Ref.

As a further example, intentional control of the number of signal paths being enabled provides the ability to adjust lock phase without introduction of a dedicated phase interpolation device. A matrix phase comparator configuration similar to that of FIG. 1 is assumed, although for descriptive simplicity only two-phase comparison elements 113 will be considered. A simplified block diagram of the resulting PLL configuration is shown in FIG. 2, with the two-phase comparator elements 113 in the first instance comparing phase VCO_000 of the local oscillator signal to Ck_Ref, and in the second instance comparing phase VCO_090 of the local oscillator signal to Ck_Ref. The branch segment weights of each phase comparator are adjusted 207, 208 to produce weighted segments that are subsequently combined and low-pass filtered 230 to generate the aggregate control signal that may be used to control the Voltage-Controlled Oscillator (VCO) 240 producing the phases of the local oscillator signal VCO_000 and VCO_090 to induce a phase offset into the phases of the local oscillator signal.

A Phase Interpolation Control Signal Generator 205 accepts a Phase Value input and produces control signals 207, 208, which, by selectively enabling numbers of branch segments in the first dynamically-weighted XOR gate and in the second dynamically-weighted XOR gate, control the relative contribution of each phase comparator instance to the aggregate control signal that may be low-pass filtered 230 and provided to VCO 240.

Figure 6:
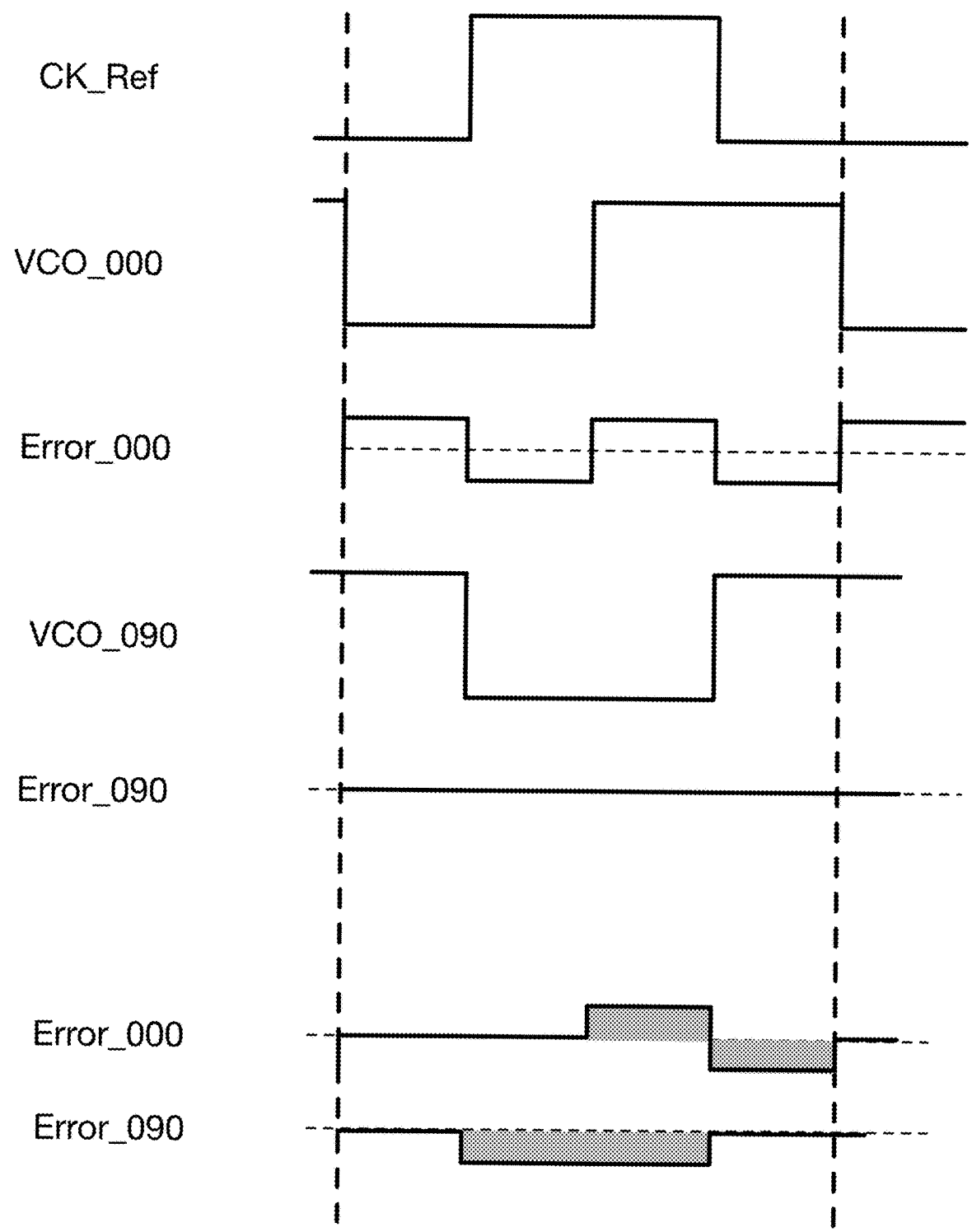
FIGS. 6, 7, 8, 9, and 10 illustrate various aggregate error signals for various reference clock signal-to-local oscillator signal relationships, in accordance with some embodiments.

FIGS. 6-10 are timing diagrams that illustrate formation of aggregate control signals, in accordance with some embodiments. References to FIG. 3 are made in the following descriptions, however it should be noted that similar examples and concepts may be extended to other similar systems. FIG. 6 illustrates a timing diagram of an interpolation between phases VCO_000 and VCO_090 of the local oscillator signal. As shown, FIG. 6 is the state of the weighted segments of phase-error signals error_000 and error_090 immediately after turning branches 330 and 340 off in a circuit as shown in FIG. 3 that is receiving a reference clock signal and phase VCO_000 of the local oscillator signal, and turning branches 330 and 340 on in a circuit as shown in FIG. 3 that is receiving the reference clock signal and phase VCO_090 of the local oscillator signal. As shown, an aggregation of the shaded portions of weighted segments error_000 and error_090 is mostly negative, and thus the local oscillator is rotated to bring the aggregate control signal to an average of zero, indicating locked condition.

Figure 7:
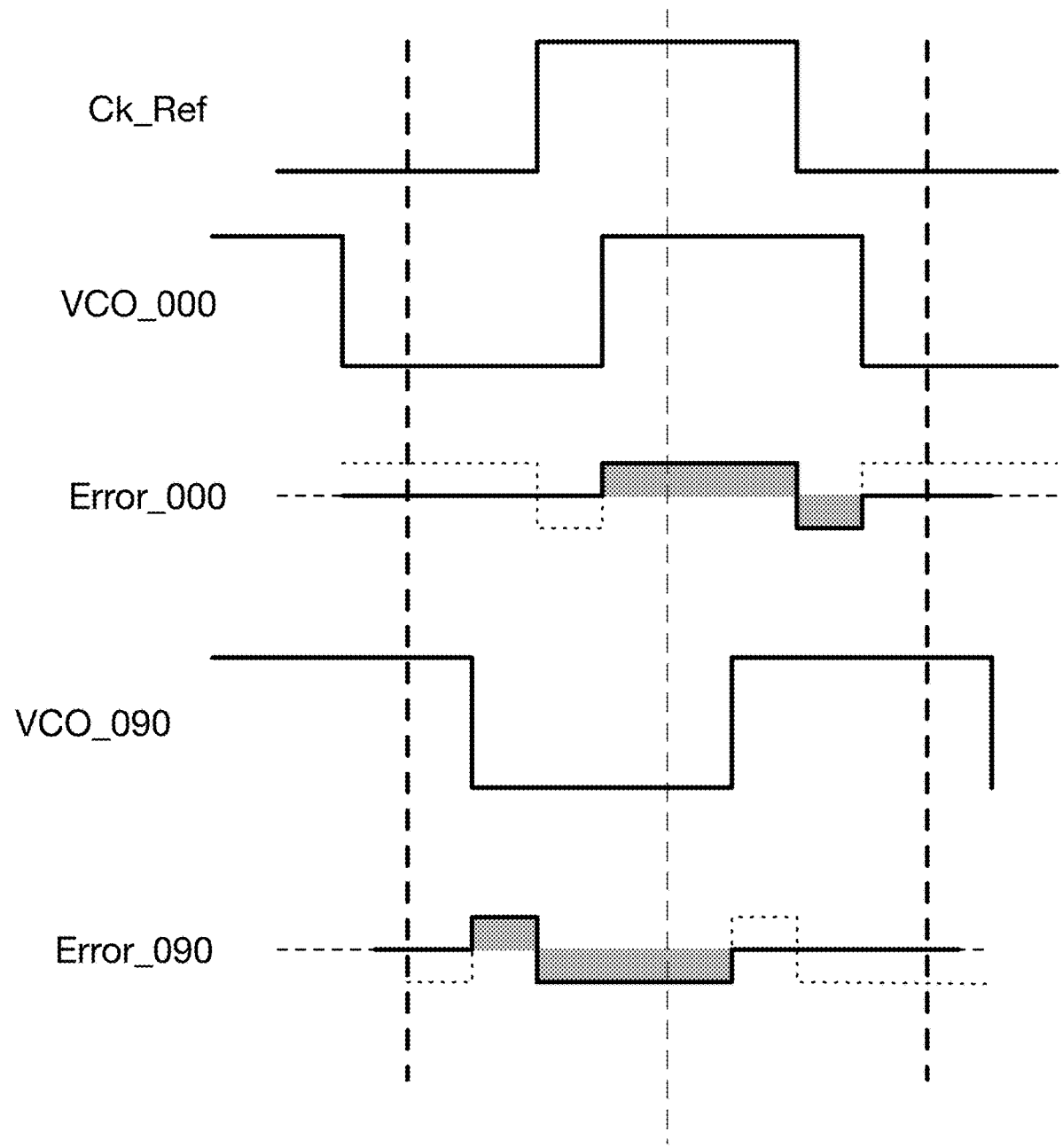

FIG. 7 illustrates the relationship of phases VCO_000 and VCO_090 of the local oscillator signal with respect to the reference clock signal upon reaching lock condition. As shown, phases VCO_000 and VCO_090 have undergone a −45 degree phase shift with respect to the reference clock signal, and a phase of 45 is now locked to the 90-degree lock point of the phase detector. One would expect such a shift, as half of the XOR detector receiving phase VCO_000 is turned on while half of the XOR detector receiving phase VCO_090 is also turned on, and thus both phases are making equal contributions to the aggregate control signal. As will be further noted, the aggregation of weighted segments of phase-error signals error_000 and error_090 thus as an average result of 0, and the VCO is thus in a lock condition in which phases VCO_000 and VCO_090 have undergone a −45 degree phase shift with respect to the 90-degree lock point described above.

Figure 8:
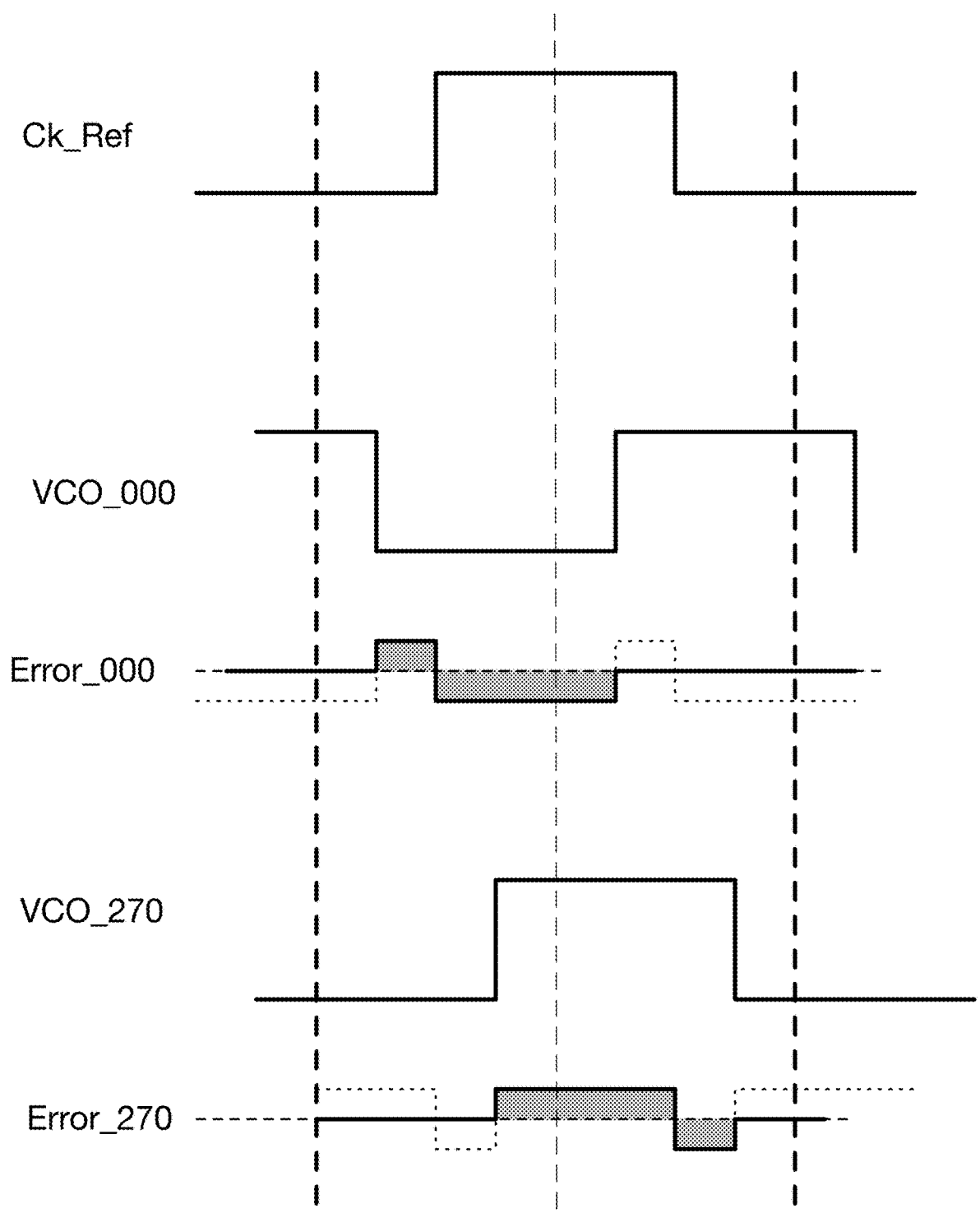

FIG. 8 illustrates a similar scenario, however in FIG. 8, branches 330 and 340 are turned off for phase VCO_000, while branches 330 and 340 are turned on in phase VCO_270. As expected, phases VCO_000 and VCO_270 undergo a +45 degree phase shift with respect to the previous lock point, and thus a phase of 315 degrees is now locked to the 90-degree lock point of the phase detector.

Figure 9:
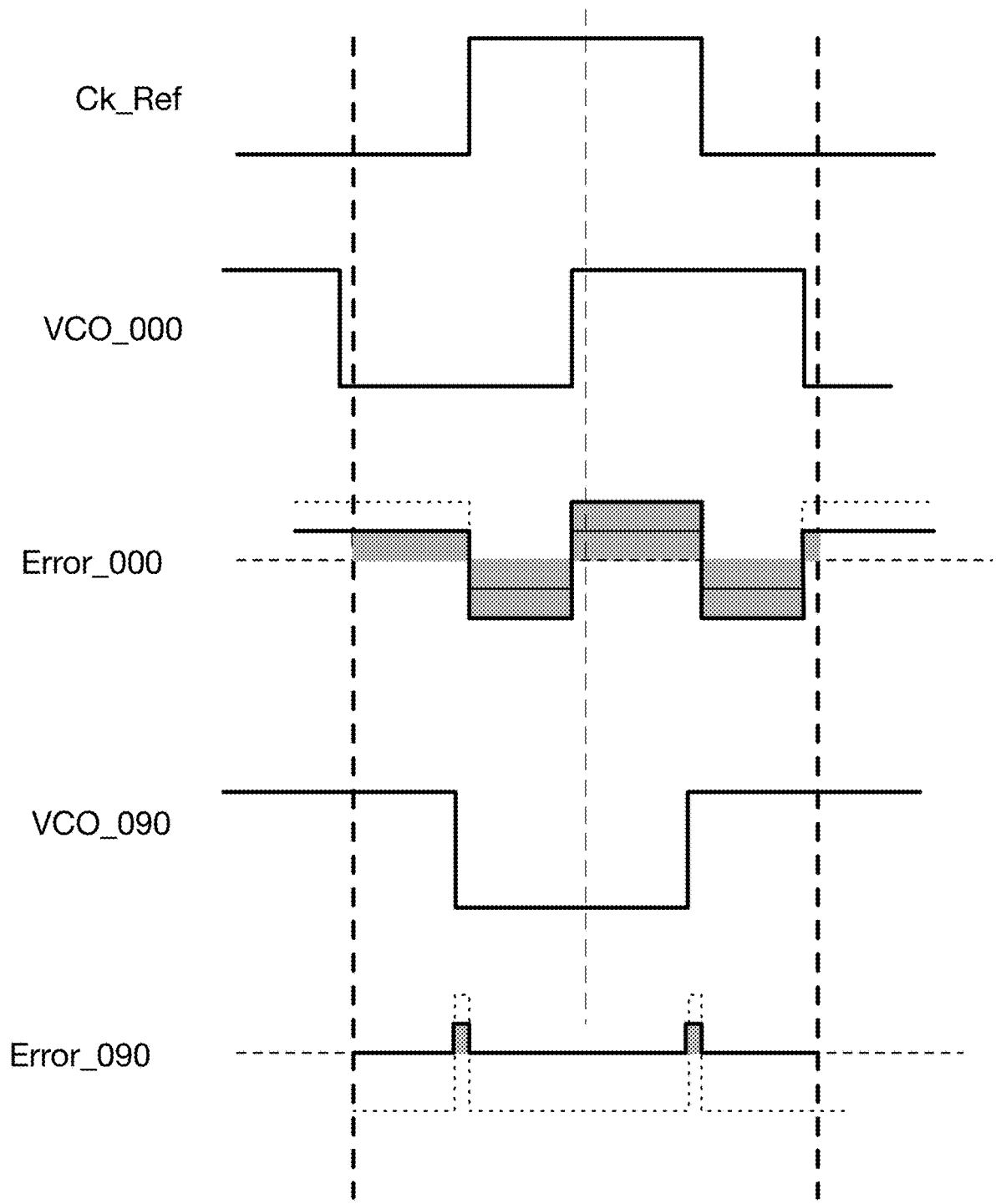

The above examples describe fully turning branches on/off for simplicity of discussion, however, as shown in FIG. 3, a branch may include a plurality of branch segments that may be individually turned off/on in adjacent phases of the local oscillator signal so that such AND operations may partially contribute to more than one phase-error signal. For example, as shown in FIG. 3, t0 and t1 may be turned off/on in the dynamically-weighted XOR gates receiving phases VCO_000/VCO_090, respectively, which only constitutes as one half of branch 330. Such a scenario is illustrated in FIG. 9. In FIG. 9, only t0 and t1 are turned off in the dynamically-weighted XOR receiving phase VCO_000, and only t0 and t1 are turned on in the dynamically-weighted XOR receiving phase VCO_090. As shown, such a configuration introduces a proportionately smaller offset of approximately −11.25 degrees of phase VCO_000 of the local oscillator signal with respect to the 90-degree lock point to the reference clock signal. The weighted segments of phase-error signals error_000 and error_090 are illustrated in FIG. 9. As shown, the weighted segment associated with branch 330 of phase-error signal error_000 has half the amplitude with respect to the rest of the branches, as only two branch segments are contributing to the weighted segment, while all four branch segments contribute to the rest of the weighted segments of phase-error signal error_000.

Figure 10:
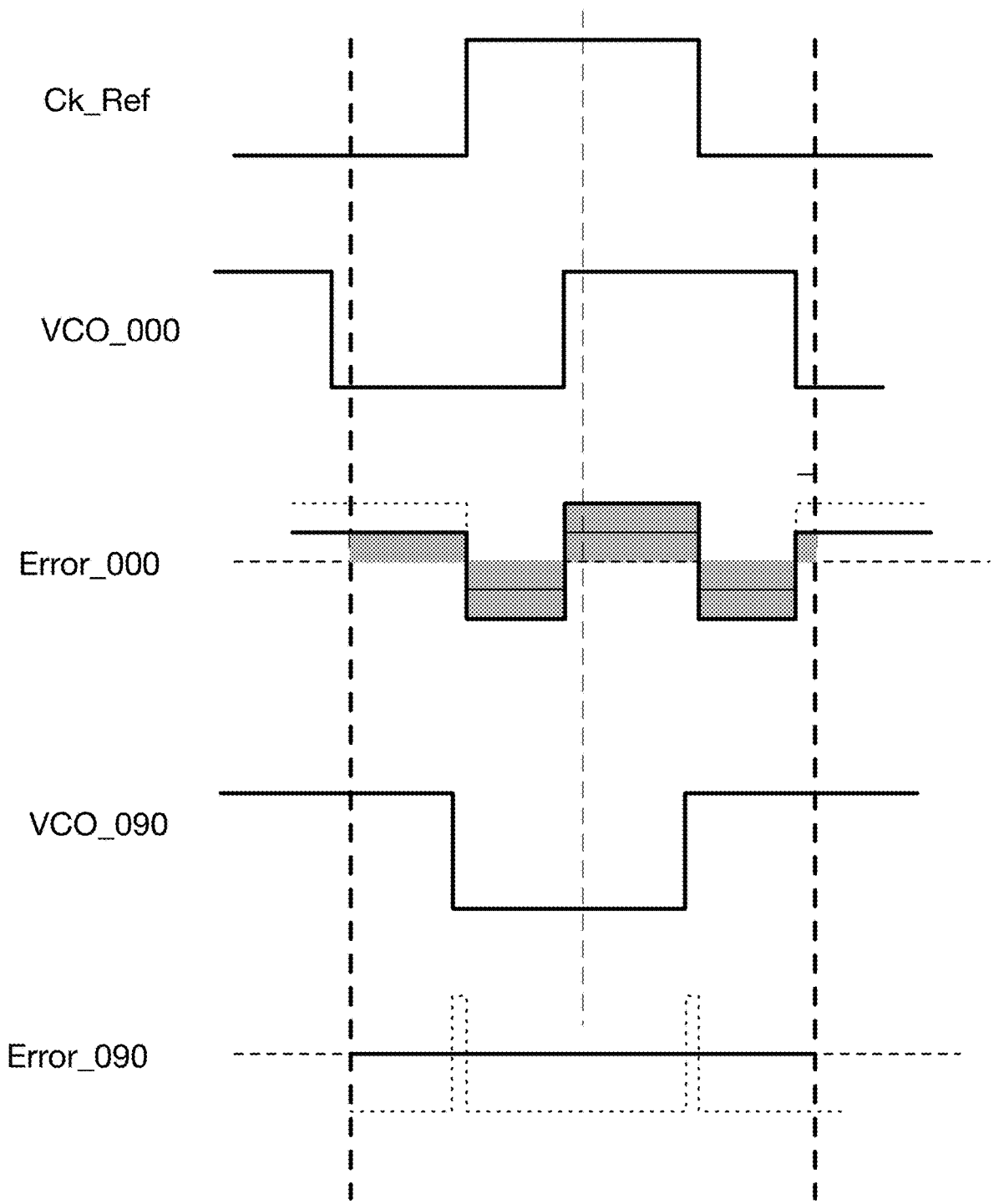

In yet another embodiment, simply turning one or more branch segments off in a branch of a dynamically-weighted XOR gate will induce a phase shift, even without turning the corresponding branch segments on in a dynamically-weighted XOR gate receiving an adjacent phase of the local oscillator signal. Such an embodiment is shown in FIG. 10. In FIG. 1, branch segments t0 and $t_1$ are turned off in the dynamically-weighted XOR gate receiving phase VCO_000 of the local oscillator signal, while no branch segments are turned on in the dynamically-weighted XOR gate receiving phase VCO_090. Such an embodiment induces a phase offset into the phases of the local oscillator signal, as the positive and negative portions of the aggregate control signal adjust their widths, e.g., by rotating the phases of the local oscillator signal to change the duty cycle of the output of the XOR gate, to compensate for the sudden negative aggregate control signal until the total positive area and total negative area are equal, thus indicating locked condition. As one may notice, the phase shift induced by the embodiment shown in FIG. 10 will be larger than that of FIG. 9. In FIG. 9, some of the positive portion of the aggregate control signal is added back in via the positively weighted segment of phase-error signal error_090, while in FIG. 10, there is no contribution from error_090. Thus, a larger shift is induced into the phases of the local oscillator signal to compensate.

Figure 11:
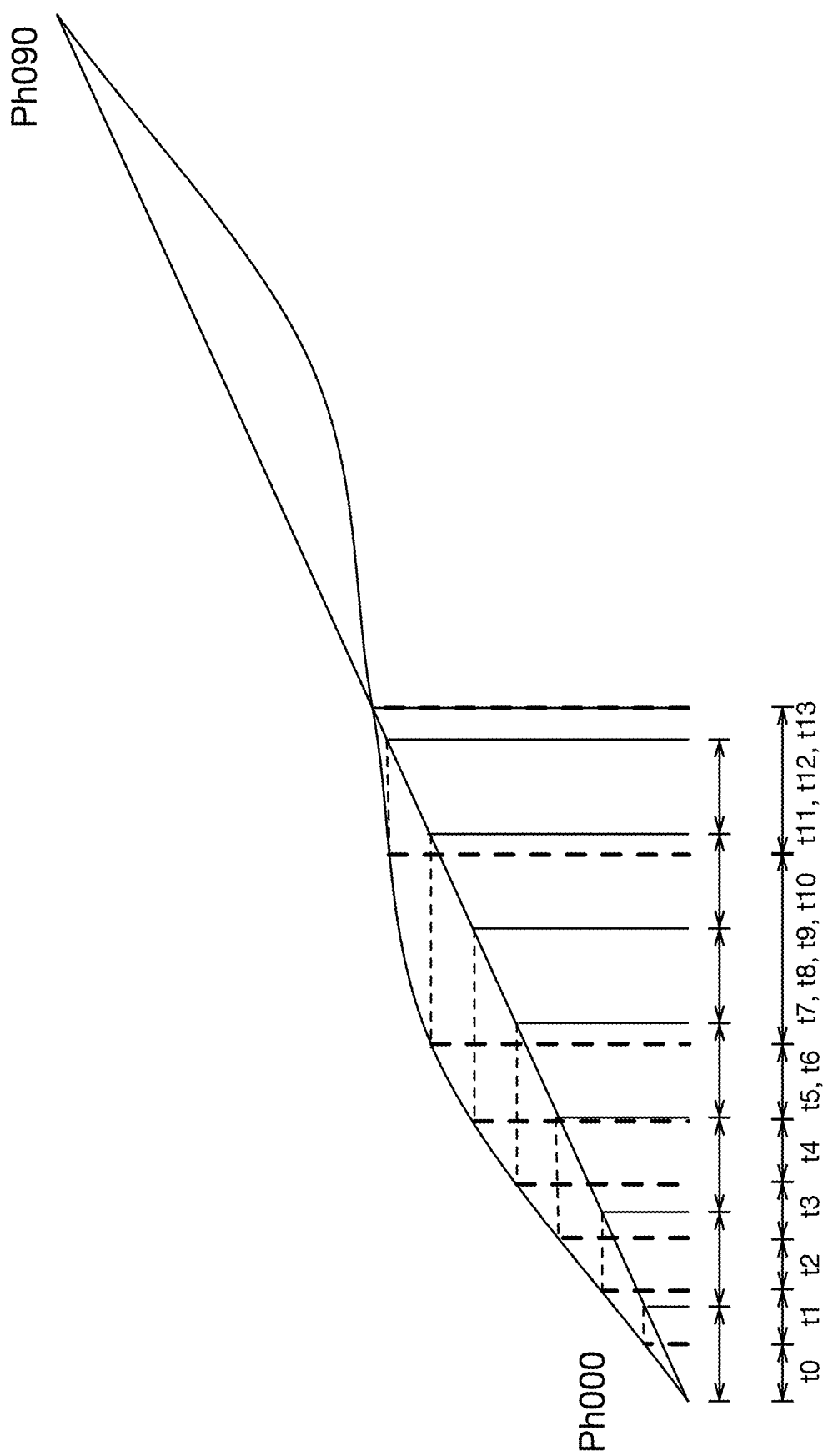
FIG. 11 illustrates how the transfer characteristics of a phase comparator may be approximated using adjustable time interval weighting.

FIG. 11 illustrates a desired linear transfer function for the phase interpolation behavior, versus the inherent non-linear result if the two signals were simply mixed by enabling or disabling a fixed number of weighted segments per adjustment step. It may be observed that the non-linear curve produced by using a fixed increment is always "above" the desired linear response, thus linearization requires fewer segments to be enabled per step. In some embodiments, a predetermined sequence of steps may be determined to achieve a more linear phase interpolation relationship, if such a relationship is desired.

Figure 12A:
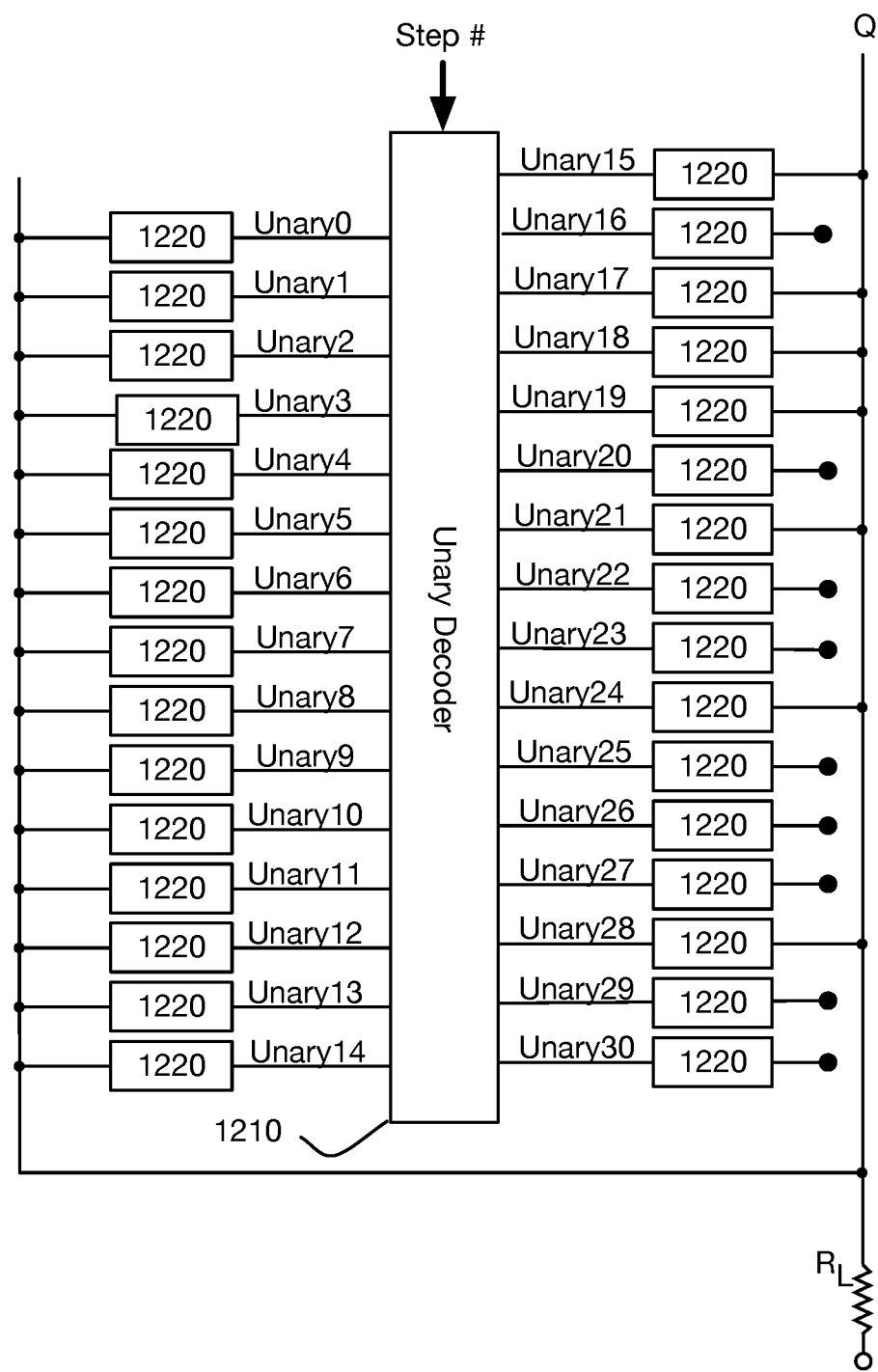
FIGS. 12A and 12B show two embodiments in which a unary selector enables a series of elements to provide a phase-control signal.

FIG. 12A is one such embodiment for closely approximating a linear interpolation operation, by selectively enabling 32 possible gating signals on a first of two phase-error signal outputs. Each instance of element 1220 represents one weighted segment in a circuit sub-element such as that of FIG. 4A, within a first dynamically-weighted XOR gate such as that of FIG. 3. Unary decoder 1210 enables a selected number of its outputs, as determined by input Step#. In such embodiments, each selected output may control a corresponding branch segment in a branch of the plurality of branches of a dynamically-weighted XOR gate. The linearization function is performed by selectively disconnecting certain instances of 1220 from the overall result Q (that is, not connecting that weighted segment to the corresponding branch segment.) Examples of disconnected branch segments include the instances of 1220 enabled by Unary16, Unary20, Unary22-23, Unary 25-27, and Unary 29-30.

Figure 12B:
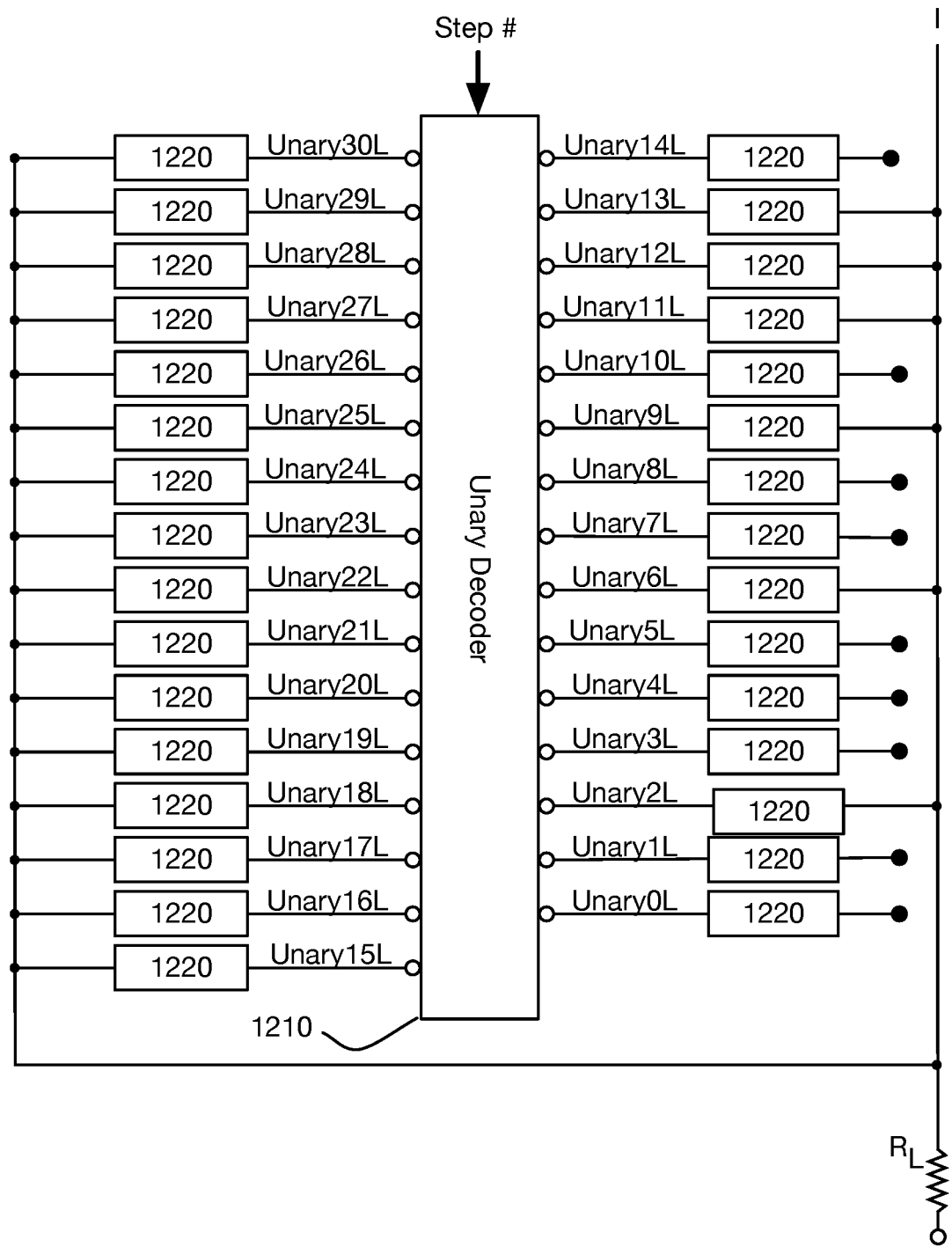

In some embodiments, the number of branch segments enabled to control a first phase-error result and the number of branch segments enabled to control a second phase-error result are coordinated as illustrated by control signal generator 205 of FIG. 2. In at least one embodiment, the number of branch segments in the second phase-error signal are inversely-weighted with respect to branch segments in the first phase-error signal. A complementary embodiment controlling a second dynamically-weighted XOR gate receiving an adjacent phase is shown in FIG. 12B. The outputs I and Q may correspond to phase-control signals 207 and 208, respectively, or vice versa.

Figure 13:
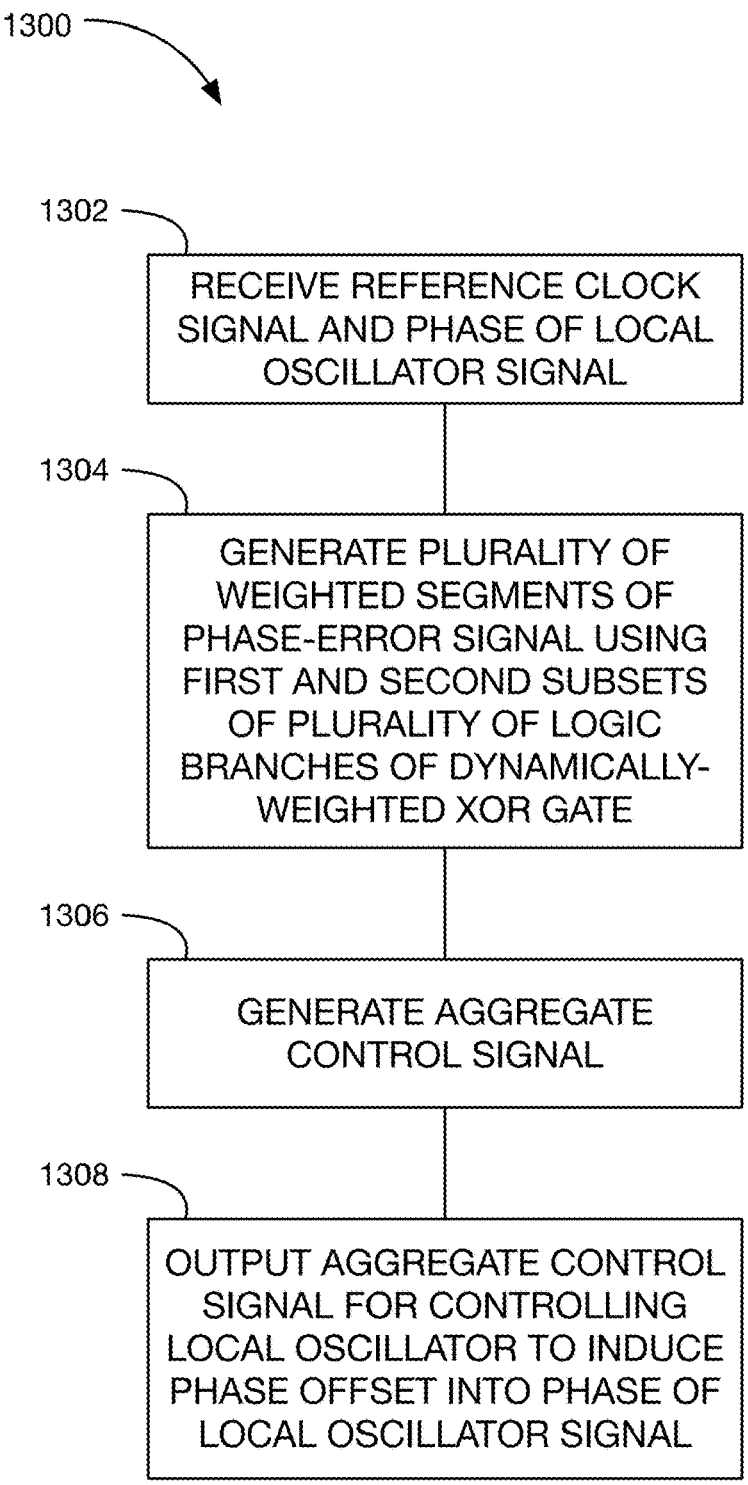
FIG. 13 is a flow chart of a method in accordance with some embodiments.

FIG. 13 is a flow chart of a method in accordance with some embodiments. As shown, method 1300 includes receiving 1302 a reference clock signal and a phase of a local oscillator signal at a dynamically-weighted XOR gate comprising a plurality of logic branches. A plurality of weighted segments of a phase error-signal are generated at 1304, the plurality of weighted segments comprising (i) positive weighted segments generated by a first subset of the plurality of logic branches when the reference clock signal and the phase of the local oscillator signal have equal logic levels and (ii) negative weighted segments generated by a second subset of the plurality of logic branches when the reference clock signal and the phase of the local oscillator signal have different logic levels, each weighted segment of the phase-error signal having a respective weight applied by a corresponding logic branch of the plurality of logic branches. An aggregate control signal is generated 1306 based on an aggregation of the weighted segments of the phase-error signal, and the aggregate control signal is output 1308 as a current-mode output for controlling a local oscillator generating the phase of the local oscillator signal, the local oscillator configured to induce a phase offset into the local oscillator signal in response to the aggregate control signal.

In some embodiments, each logic branch comprises a plurality of branch segments connected in parallel. In such embodiments, the method further includes generating a phase-control signal comprising a plurality of bits. In some embodiments, each branch segment is enabled according to a respective bit of the plurality of bits of the phase-control signal. In some embodiments, each branch segment is enabled according to a corresponding enabling transistor receiving the respective bit as an input. In some embodiments, the respective weight for a given weighted segment is determined by a number of branch segments enabled in the logic branch.

In some embodiments, the respective weight for a given weighted segment is determined in part by transistor dimensions in the logic branch. In alternative embodiments, the respective weight for a given segment is determined in part by a tunable impedance connected to the logic branch.

In some embodiments, the aggregate control signal is further generated based on weighted segments in a second phase-error signal generated using the reference clock signal and a second phase of the local oscillator signal that is adjacent to the phase of the local oscillator signal. In some such embodiments, weighted segments in the second phase-error signal are inversely-weighted with respect to weighted segments in the first phase-error signal. In some embodiments, the induced phase offset corresponds to a non-zero average of the aggregate control signal.

In some embodiments, a method includes receiving a reference clock signal, and first and second phases of a local oscillator signal. Corresponding sets of weighted segments of a first and a second phase-error signal are generated by comparing the reference clock signal to the first and the second phases of the local oscillator signal, respectively, each corresponding set of weighted segments generated by a plurality of logic branches of a respective dynamically-weighted XOR gate, wherein the weighted segments in each of the first and second phase-error signals comprise first and second sets of weights, respectively, the first and second sets of weights selected according to a predetermined phase-offset value. An aggregate control signal is generated based on a summation of the weighted segments of the first and second phase-error signals, and the aggregate control signal is output as a current-mode output for controlling a local oscillator generating the first and second adjacent phases of the local oscillator signal, the local oscillator configured to induce a phase offset into the first and second phases of the local oscillator signal in response to the aggregate control signal by an amount associated with the predetermined phase-offset value.

In some embodiments, the weighted segments in each of the first and second segmented phase-error signals include (i) positive weighted segments generated by a first subset of the plurality of logic branches when the reference clock signal and the corresponding phase of the local oscillator signal have equal logic levels and (ii) negative weighted segments generated by a second subset of the plurality of logic branches when the reference clock signal and the corresponding phase of the local oscillator signal have different logic levels.

In some embodiments, the first and second sets of weights correspond to a total number of logic branch segments enabled in the respective dynamically-weighted XOR gates.

In some embodiments, the first and second sets of weights are selected according to a phase-control signal representing the predetermined phase-offset value of the first and second phases of the local oscillator signal. In some such embodiments, the phase-control signal is generated by a phase-control signal generator. In some embodiments, the phase-control signal generator includes a lookup table and is configured to select a phase-control signal from the lookup table. In some such embodiments, the lookup table may include phase-control signal steps that implement a linear interpolation function. In some embodiments, the phase-control signal may be a thermometer code. In such embodiments, the dynamically-weighted XOR receiving the first phase of the local oscillator signal may receive a thermometer code that is an inverse of a thermometer code received by the dynamically-weighted XOR receiving the second phase of the local oscillator signal.

In some embodiments, the first and second phases of the local oscillator signal have phase differences of 45 degrees. In some embodiments, the first and second phases of the local oscillator signal may have phase differences of 90 degrees or 180 degrees. In some embodiments, the first and second phases of the local oscillator signal may be adjacent phases in that they are pulled from adjacent ring oscillator elements in a local oscillator.

The invention claimed is:

1. A method comprising:

receiving a reference clock signal and a phase of a local oscillator signal at a dynamically-weighted XOR gate comprising a plurality of logic branches, each logic branch enabled responsive to a respective input logic combination of the reference clock signal and the phase of the local oscillator signal;

generating a plurality of weighted segments of a phase-error signal, the plurality of weighted segments comprising (i) positive weighted segments generated by a first subset of the plurality of logic branches when the reference clock signal and the phase of the local oscillator signal have equal logic levels and (ii) negative weighted segments generated by a second subset of the plurality of logic branches when the reference clock signal and the phase of the local oscillator signal have different logic levels, each weighted segment of the phase-error signal having a respective weight applied by a corresponding logic branch of the plurality of logic branches, wherein at least two weighted segments of the plurality of weighted segments have different weights;

generating an aggregate control signal based on an aggregation of the weighted segments of the phase-error signal; and outputting the aggregate control signal as a current-mode output for controlling a local oscillator generating the phase of the local oscillator signal, the local oscillator configured to induce a phase offset into the local oscillator signal in response to the aggregate control signal.

2. The method of claim 1, wherein each logic branch comprises a plurality of branch segments connected in parallel.

3. The method of claim 2, further comprising generating a phase-control signal comprising a plurality of bits, and wherein each branch segment is enabled according to a respective bit of the plurality of bits of the phase-control signal.

4. The method of claim 3, wherein each branch segment is enabled according to a corresponding enabling transistor receiving the respective bit as an input.

5. The method of claim 3, wherein generating the phase-control signal comprises selecting a value corresponding to the phase offset from a lookup table.

6. The method of claim 2, wherein the respective weight for a given weighted segment is determined by a number of branch segments enabled in the logic branch.

7. The method of claim 1, wherein the respective weight for a given weighted segment is determined in part by transistor dimensions in the logic branch.

8. The method of claim 1, wherein the respective weight for a given weighted segment is determined in part by a tunable impedance connected to the logic branch.

9. The method of claim 1, wherein the aggregate control signal is further generated based on weighted segments in a second phase-error signal generated using the reference clock signal and a second phase of the local oscillator signal that is adjacent to the phase of the local oscillator signal.

10. The method of claim 9, wherein the first and second phase-error signals are generated using sets of inversely-enabled branch segments.

11. An apparatus comprising:

a plurality of logic branches of a dynamically-weighted XOR gate, the plurality of logic branches configured to receive a reference clock signal and a phase of a local oscillator signal and to responsively generate a plurality of weighted segments of a phase-error signal, each weighted segment of the phase-error signal generated by a corresponding logic branch enabled responsive to a respective input logic combination of the reference clock and the phase of the local oscillator and having a respective weight selectively applied by a corresponding logic branch of the plurality of logic branches, wherein at least two weighted segments of the plurality of weighted segments have different weights, the plurality of logic branches comprising:

a first subset of the plurality of logic branches configured to generate positive weighted segments when the reference clock signal and the phase of the local oscillator signal have equal logic levels;

a second subset of the plurality of logic branches configured to generate negative weighted segments when the reference clock signal and the phase of the local oscillator signal have different logic levels; and a common node connected to the plurality of logic branches configured to generate an aggregate control signal based on an aggregation of the weighted segments of the phase-error signal, and to responsively output the aggregate control signal as a current-mode output for controlling a local oscillator generating the phase of the local oscillator signal, the local oscillator configured to induce a phase offset into the local oscillator signal in response to the aggregate control signal.

12. The apparatus of claim 11, wherein each logic branch comprises a plurality of branch segments connected in parallel.

13. The apparatus of claim 12, further comprising a phase interpolator control signal generator configured to generate a phase-control signal comprising a plurality of bits, and wherein each branch segment is enabled according to a respective bit of the plurality of bits of the phase-control signal.

14. The apparatus of claim 13, wherein each branch segment comprises a corresponding enabling transistor configured to receive the respective bit as an input.

15. The apparatus of claim 13, wherein the phase interpolator control signal generator is configured to generate the phase-control signal by selecting a value corresponding to the phase offset from a lookup table.

16. The apparatus of claim 12, wherein the respective weight for a given weighted segment is determined by a number of branch segments enabled in the logic branch.

17. The apparatus of claim 11, wherein the respective weight for a given weighted segment is determined in part by transistor dimensions in the logic branch.

18. The apparatus of claim 11, wherein the respective weight for a given weighted segment is determined in part by a tunable impedance connected to the logic branch.

19. The apparatus of claim 11, wherein the aggregate control signal is further generated based on weighted segments in a second phase-error signal generated using the reference clock signal and a second phase of the local oscillator signal that is adjacent to the phase of the local oscillator signal.

20. The apparatus of claim 19, wherein the first and second phase-error signals are generated using sets of inversely-enabled branch segments.

* * * * *